(12) United States Patent
Shin et al.

(10) Patent No.: US 11,094,774 B2
(45) Date of Patent: Aug. 17, 2021

(54) ORGANIC LIGHT EMITTING DIODE DISPLAY DEVICE

(71) Applicant: Samsung Display Co., Ltd., Yongin-Si (KR)

(72) Inventors: Hyuneok Shin, Gwacheon-si (KR); Byoungyong Kim, Seoul (KR); Jang-Hyun Kim, Hwaseong-si (KR); Sangwoo Sohn, Yongin-si (KR); Sangwon Shin, Yongin-si (KR); Sukyoung Yang, Hwaseong-si (KR); Dongmin Lee, Anyang-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/673,843

(22) Filed: Nov. 4, 2019

(65) Prior Publication Data
US 2020/0144356 A1    May 7, 2020

(30) Foreign Application Priority Data

Nov. 7, 2018   (KR) .......................... 10-2018-0135562

(51) Int. Cl.
*H01L 27/32* (2006.01)
*H01L 51/52* (2006.01)

(52) U.S. Cl.
CPC ...... *H01L 27/3279* (2013.01); *H01L 27/3248* (2013.01); *H01L 27/3258* (2013.01); *H01L 51/5246* (2013.01); *H01L 2251/301* (2013.01)

(58) Field of Classification Search
CPC ............. H01L 27/3248; H01L 51/5246; H01L 27/3258; H01L 2251/301; H01L 27/3276; H01L 27/3244
See application file for complete search history.

(56) References Cited

U.S. PATENT DOCUMENTS

| | | | |
|---|---|---|---|
| 2008/0094321 A1* | 4/2008 | Park | G09G 3/3225 345/76 |
| 2008/0284048 A1* | 11/2008 | Kim | H01L 24/14 257/797 |
| 2014/0339574 A1* | 11/2014 | Kang | G02F 1/133305 257/88 |
| 2016/0363800 A1* | 12/2016 | Kim | G02F 1/13452 |

FOREIGN PATENT DOCUMENTS

KR    10-2016-0097464 A    8/2016

* cited by examiner

*Primary Examiner* — Cuong B Nguyen
(74) *Attorney, Agent, or Firm* — Innovation Counsel LLP

(57) ABSTRACT

A display device may include a first substrate, a pixel, a contact electrode, and a side electrode. The pixel may overlap a first face of the first substrate. The contact electrode may be electrically connected to the pixel. A first face of the contact electrode may overlap the first face of the first substrate. The side electrode may be positioned beyond the first substrate. A first face of the side electrode may directly contact a second face of the contact electrode. The second face of the contact electrode may be not parallel to the first face of the contact electrode.

20 Claims, 17 Drawing Sheets

ORGANIC LIGHT EMITTING DIODE DISPLAY DEVICE

CROSS-REFERENCE TO RELATED APPLICATION(S)

This application claims priority under 35 USC § 119 to Korean Patent Application No. 10-2018-0135562, filed on Nov. 7, 2018 in the Korean Intellectual Property Office (KIPO); the contents of the Korean Patent Application are incorporated herein by reference.

BACKGROUND

1. Field

The technical field relates to an organic light emitting diode display device.

2. Description of the Related Art

Modern display devices include liquid crystal display (LCD) devices and organic light emitting diode (OLED) display devices. It is desirable for a display device to have a maximum display area and a minimum non-display area.

A display device may include electrodes for connecting to an external device in order to receive signals from the external device. For accommodating the electrodes, the display device may have an undesirably large non-display area.

SUMMARY

Some embodiments may be related to a display device, e.g., an organic light emitting diode (OLED) display device, including a side electrode.

According to some example embodiments, an OLED display device includes a lower substrate, a plurality of sub-pixel structures, an upper substrate, a pad electrode, and a side electrode. The lower substrate has a display region and a peripheral region surrounding the display region. The sub-pixel structures are disposed in the display region on the lower substrate. The upper substrate is disposed on the sub-pixel structures. The pad electrode is disposed in the peripheral region between the lower substrate and the upper substrate, and one side surface of the pad electrode is exposed. The side electrode is disposed in one side surface of the lower and upper substrates, and is in contact with one side surface of the pad electrode.

In example embodiments, the side electrode may be protruded from one side surface of the lower and upper substrates in a first direction.

In example embodiments, a size of the lower substrate may be identical to a size of the upper substrate, and the lower and upper substrates may be overlapped to each other.

In example embodiments, the side electrode may include a first metal layer in contact with the pad electrode and a second metal layer disposed on the first metal layer.

In example embodiments, an electrical resistance of the second metal layer may be lower than an electrical resistance of the first metal layer, and an adhesive force of the first metal layer may be greater than an adhesive force of the second metal layer.

In example embodiments, the first metal layer may include at least one selected from titanium (Ti), molybdenum (Mo), nickel (Ni), tantalum (Ta), and neodymium (Nd).

In example embodiments, the second metal layer may include at least one selected from silver (Ag), copper (Cu), aluminum (Al), and gold (Au).

In example embodiments, the side electrode may further include a third metal layer disposed on the second metal layer, and a mechanical strength of the third metal layer may be greater than a mechanical strength of the first and second metal layers each.

In example embodiments, the pad electrode may extend in one direction from the peripheral region into the display region, and may be electrically connected to the sub-pixel structure.

In example embodiments, the pad electrode may include first through (n)th pad electrodes (where n is an integer more than 2). The first through (n)th pad electrodes may be spaced apart from each other, and may be arranged along a second direction in the peripheral region.

In example embodiments, the side electrode may include first through (m)th side electrodes (where m is an integer more than 2), and the first through (m)th side electrodes may be in contact with the first through (n)th pad electrodes, respectively.

In example embodiments, the OLED display device may further include first through (p)th organic patterns (where p is an integer more than 1). A (k)th organic pattern, where k is an integer between 1 and p, among the first through (p)th organic patterns may be disposed between (h)th and (h+1)th side electrodes, where h is an integer between 1 and m, among the first through (m)th side electrodes.

In example embodiments, the OLED display device may further include a plurality of semiconductor elements, and each of the semiconductor elements may include an active layer disposed on the lower substrate, a gate insulation layer disposed on the active layer, a gate electrode disposed on the gate insulation layer, an insulating interlayer disposed on the gate electrode, and source and drain electrodes disposed on the insulating interlayer.

In example embodiments, the pad electrode may include a first pad electrode pattern disposed on the lower substrate and a second pad electrode pattern disposed on the first pad electrode pattern.

In example embodiments, the first pad electrode pattern and the gate electrode may be simultaneously formed using same materials, and the source and drain electrodes and the second pad electrode pattern may be simultaneously formed using same materials.

In example embodiments, the gate insulation layer and the insulating interlayer might not be disposed under the pad electrode.

In example embodiments, the OLED display device may further include a seal member disposed between the lower and upper substrates in the peripheral region.

In example embodiments, the seal member may cover at least a portion of the pad electrode.

In example embodiments, one side surface of the seal member may be in contact with the side electrode in a portion where the seal member is in contact with the pad electrode.

In example embodiments, each of the sub-pixel structures may include a plurality of lower electrodes disposed on the lower substrate, a plurality of light emitting layers disposed on the lower electrode, respectively, and an upper electrode disposed on the light emitting layers.

An embodiment may be related to a display device. The display device may include a first substrate, a pixel, a contact electrode, and a side electrode. The pixel may overlap a first face of the first substrate. The contact electrode may be electrically connected to the pixel. A first face of the contact electrode may overlap the first face of the first substrate. The side electrode may be positioned beyond the first substrate. A first face of the side electrode may be parallel to and directly contact a second face of the contact electrode. The second face of the contact electrode may be perpendicular to and not parallel to the first face of the contact electrode. The side electrode may cover the second face of the contact electrode.

The first face of the side electrode may be parallel to a second face of the first substrate. The second face of the first substrate may be perpendicular to and not parallel to the first face of the first substrate.

The display device may include a second substrate. The contact electrode may be positioned between the first face of the first substrate and a first face of the second substrate. A second face of the first substrate may be coplanar with a second face of the second substrate and may be coplanar with the second face of the contact electrode.

The side electrode may include the following elements: a first metal layer directly contacting the contact electrode; and a second metal layer disposed on the first metal layer. The first metal layer may be positioned between the contact electrode and the second metal layer.

An electrical resistance of the second metal layer may be lower than an electrical resistance of the first metal layer. An adhesive force of the first metal layer may be greater than an adhesive force of the second metal layer.

The first metal layer may include at least one of titanium (Ti), molybdenum (Mo), nickel (Ni), tantalum (Ta), and neodymium (Nd).

The second metal layer may include at least one of silver (Ag), copper (Cu), aluminum (Al), and gold (Au).

The side electrode may further include a third metal layer disposed on the second metal layer. The second metal layer may be positioned between the first metal layer and the third metal layer. A mechanical strength of the third metal layer may be greater than each of a mechanical strength of the first metal layer and a mechanical strength of the second metal layer.

A material of the contact electrode may be identical to at least one of a material of a gate electrode of the pixel and a material of a drain electrode of the pixel.

The display device may include a second substrate. The contact electrode may be positioned between the first face of the first substrate and a first face of the second substrate and may be positioned closer to the first substrate than to the second substrate. The first face of the side electrode may be parallel to and directly contact a second face of the second substrate.

The first face of the side electrode may be parallel to and directly contact a second face of the first substrate.

The display device may include an organic member directly contacting a second face of the side electrode. The second face of the side electrode may be perpendicular to and not parallel to the first face of the side electrode.

The pixel may include a transistor. The transistor may include a first transistor electrode and a second transistor electrode. The contact electrode may include a first conductive layer and a second conductive layer. The first conductive layer may be positioned between the first substrate and the second conductive layer. A material of the first conductive layer may be identical to a material of the first transistor electrode. A material of the second conductive layer may be identical to a material of the second transistor electrode.

The first transistor electrode may be a gate electrode. The second transistor electrode may be a drain electrode.

The first conductive layer may be parallel to and directly contact the first substrate. The gate electrode may be spaced from the first substrate.

The display device may include the following elements: a gate insulation layer positioned between the first transistor electrode and the first substrate; and an insulating interlayer positioned between the first transistor electrode and the second transistor electrode. Both the gate insulation layer and the insulating interlayer may be spaced from the contact electrode.

The display device may include the following elements: a second substrate; and a seal member disposed between the first substrate and the second substrate, directly contacting the second substrate, and directly contacting the contact electrode.

The seal member may partially cover the contact electrode and may partially expose the contact electrode.

The seal member may directly contact the first face of the side electrode.

The contact electrode may include a first conductive layer and a second conductive layer. The first conductive layer may be positioned between the first substrate and the second conductive layer. The seal member may be narrower than the first conductive layer and wider than the second conductive layer in a direction parallel to the first face of the first substrate.

In accordance with embodiments, a non-display area of a display device may be minimized. In embodiments, a display device may be readily electrically connected to an external device.

DETAILED DESCRIPTION OF EMBODIMENTS

Example embodiments are described with reference to the accompanying drawings.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

The term "conductive" may mean "electrically conductive." The term "connect" may mean "electrically connect." The term "insulate" may mean "electrically insulate." The term "pattern" may mean "member." The term "pad electrode" may mean "contact electrode." The term "electrode" may mean "electrode set." The term "sub-pixel structure" may mean "display element." The term "semiconductor element" may mean 'transistor." A "pixel" may include a display element and a transistor. The term "contact" may mean "directly mechanically/physically contact" or "direct mechanical/physical contact." The description that a first face directly contacts a second face may mean that the first face is parallel to and directly contacts the second face. The description that an element may include a list of materials may mean that the element may include at least one of the materials. The description that an element may be formed using a list of materials may mean that the element may be formed using at least one of the materials.

Figure 1:
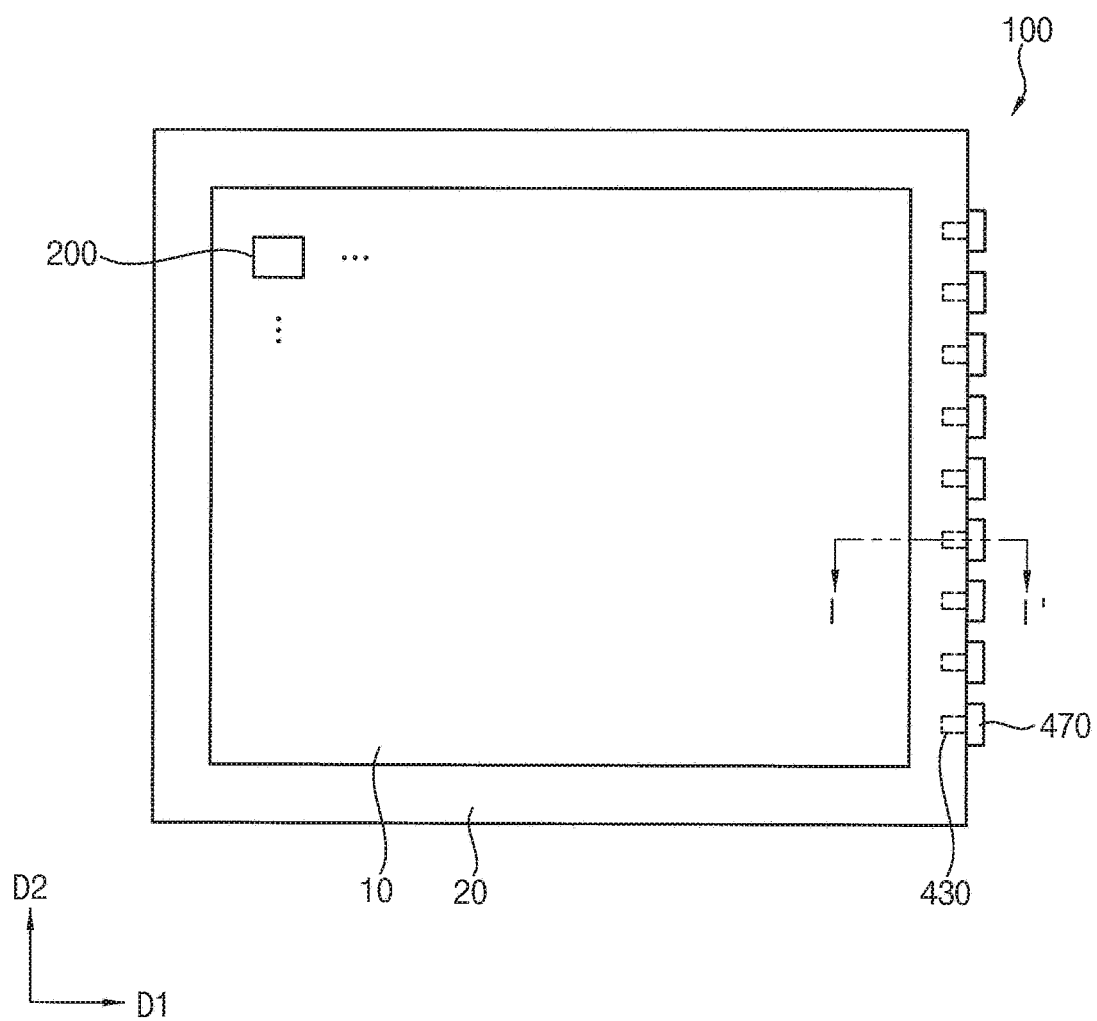
FIG. 1 is a plan view illustrating an organic light emitting diode (OLED) display device in accordance with example embodiments.
Figure 2:
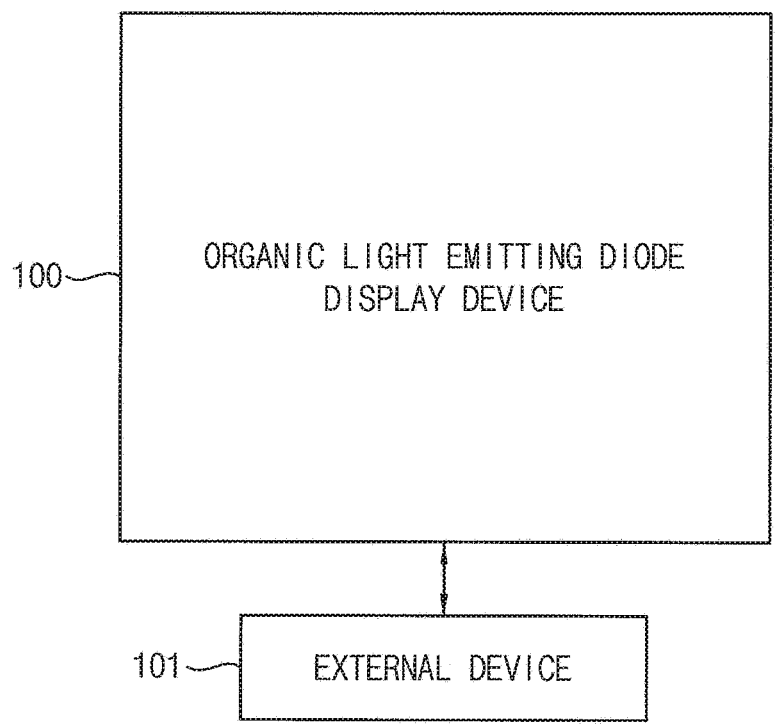
FIG. 2 is a block diagram illustrating an external device electrically connected to the OLED display device of FIG. 1 in accordance with example embodiments.
Figure 3:
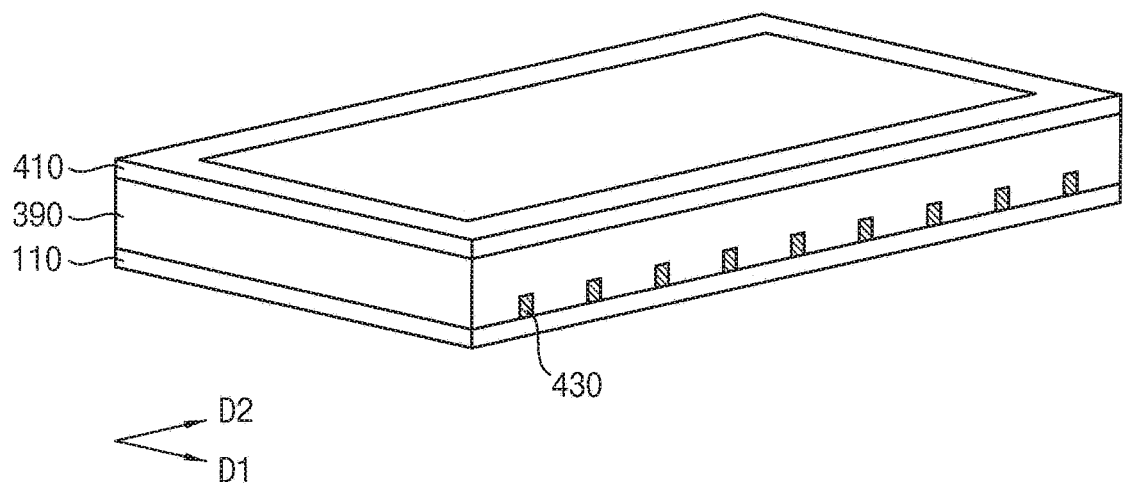
FIG. 3 is a perspective view illustrating pad electrodes included in the OLED display device of FIG. 1 in accordance with example embodiments.
Figure 4:
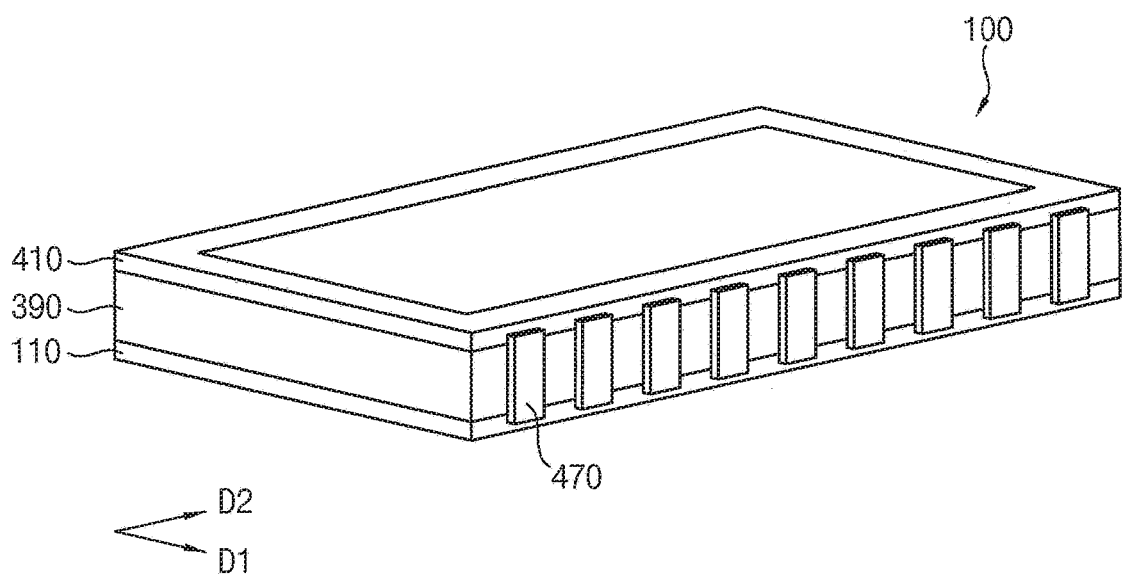
FIG. 4 is a perspective view illustrating the OLED display device in accordance with example embodiments.
Figure 5:
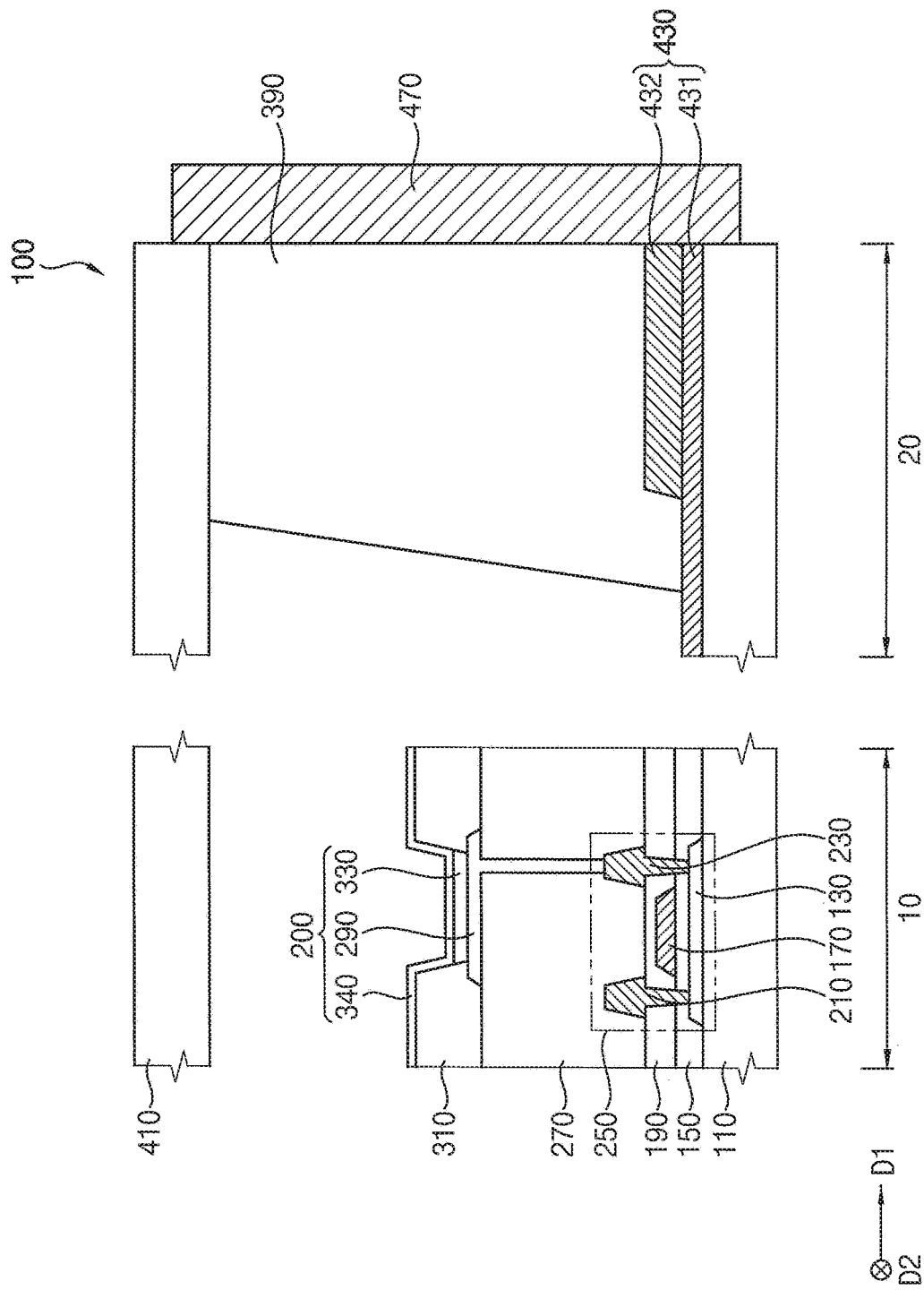
FIG. 5 is a cross-sectional view taken along a line I-I' of FIG. 1 in accordance with example embodiments.

FIG. 1 is a plan view illustrating an organic light emitting diode (OLED) display device in accordance with example embodiments. FIG. 2 is a block diagram for describing an external device electrically connected to the OLED display device of FIG. 1. FIG. 3 is a perspective view for describing a pad electrode included in the OLED display device of FIG. 1. FIG. 4 is a perspective view illustrating the OLED display device in accordance with example embodiments. For example, FIG. 3 illustrates an OLED display device 100 except for a side electrode 470, for convenience of descriptions. FIG. 5 is a cross-sectional view taken along a line I-I' of FIG. 1 in accordance with example embodiments.

Referring to FIGS. 1, 2, 3, 4, and 5, an OLED display device 100 may include a lower substrate 110, sub-pixel structures 200, an upper substrate 410, a seal member 390, pad electrodes 430 (or contact electrodes 430), side electrodes 470, etc. The OLED display device 100 and/or the lower substrate 110 may have a display region 10 and a peripheral region 20. The peripheral region 20 may surround the display region 10.

The sub-pixel structures 200 (e.g., a sub-pixel structure 200 illustrated in FIG. 5) may be disposed in the display region 10. An image may be displayed in the display region 10 through/by the sub-pixel structures 200. Wirings (e.g., gate signal wiring, data signal wiring, gate initialization signal wiring, initialization voltage wiring, light emission signal wiring, power supply wiring, etc.) may be disposed in the peripheral region 20.

As illustrated in FIGS. 1 and 3, a plurality of the pad electrodes 430 may be disposed in a the peripheral region 20. In example embodiments, the pad electrodes 430 may be interposed between the lower substrate 110 and the upper substrate 410, and one side surface of the pad electrodes 430 each may be exposed by the seal member 390. Each of the pad electrodes 430 may extend from the peripheral region 20 into the display region 10 and may be electrically connected to one or more of the sub-pixel structures 200. The pad electrodes 430 may be connected to at least some of the wirings disposed in the display region 10.

In example embodiments, as the pad electrodes 430 are disposed between the lower substrate 110 and the upper substrate 410 with coplanar side surfaces of the pad electrodes 430 exposed by the seal member 390, a face of the lower substrate 110 may be coplanar with the coplanar side surfaces of the pad electrodes 430 and may be coplanar with a face of the upper substrate 410, and a size of the lower substrate 110 may be equal to a size of the upper substrate 410. Since the lower substrate 110 does not protrude beyond the upper substrate 410 in a plan view of the OLED display device 100, the non-display area of the OLED display device 100 may be minimized.

As illustrated in FIGS. 1 and 4, the side electrodes 470 may be disposed on one side surface of each of the substrates 110 and 410. Each of the side electrodes 470 may be in direct contact with one side surface of a corresponding one of the pad electrodes 430. The side electrodes 470 may completely cover the coplanar side surfaces of the pad electrodes 430, respectively, such that the pad electrodes 430 are not exposed. The side electrodes may protrude from/beyond one face of each of the substrates 110 and 410 in a first direction D1. The face of each of the substrates 110 and 410 may be coplanar with the coplanar side surfaces of the pad electrodes 430.

The pad electrodes 430 may include first through (n)th pad electrodes (where n is an integer more than 2), and the first through (n)th pad electrodes may be spaced apart from each other, and are arranged along a second direction D2, which is perpendicular to the first direction D1. The side electrodes 470 may include first through (m)th side electrodes (where m is an integer more than 2), and the first through (m)th side electrodes may be in direct contact with the first through (n)th pad electrodes, respectively, wherein m may be equal to n.

Referring to FIGS. 1, 2, 3, and 4, the side electrodes 470 may be electrically connected to an external device 101. For example, the external device 101 may generate a gate signal, a data signal, a gate initialization signal, an initialization voltage, a light emission signal, a power supply, etc. The external device 101 may be electrically connected to the OLED display device 100 through the side electrodes 470, the pad electrodes 430, the wirings, a flexible printed circuit board (FPCB), etc., and may provide the gate signal, the data signal, the gate initialization signal, the initialization voltage, the light emission signal, the power supply, etc. to the OLED display device 100. For example, a first portion of the FPCB may be in direct contact with the side electrodes 470, and a second portion, which is opposite to the first portion, of the FPCB may be in direct contact with the external device 101. A driving integrated circuit may be installed in the FPCB.

As illustrated in FIGS. 3, 4, and 5, the seal member 390 may be disposed in the peripheral region 20 between the lower substrate 110 and the upper substrate 410. The seal member 390 may be disposed along the peripheral region 20, and may have a shape of a substantially hollow rectangle in a plan view of the OLED display device 100. In example embodiments, the seal member 390 may cover at least a portion of each of the pad electrodes 430 in the peripheral region 20. One side surface of the seal member 390 may be in direct contact with the side electrodes 470 and may be coplanar with the coplanar side surfaces of the pad electrodes 430.

In a conventional OLED display device, pad electrodes may be disposed in a pad region on a lower substrate, and the lower substrate may be longer than an upper substrate such that the pad electrodes are in direct contact with an FPCB. The lower substrate may protrude beyond, and the pad electrodes may be disposed in a protruded portion of the lower substrate. The conventional OLED display device may have a relatively large non-display region (e.g., a peripheral region) due to the pad region of the lower substrate.

The OLED display device 100 according to example embodiments that do not require a pad region that protrudes beyond the upper substrate 410. Advantageously, a non-display area of the OLED display device 100 may be minimized.

In example embodiments, the pad electrodes 430 and the side electrodes 470 are disposed only in a first portion of the peripheral region 20. In embodiments, pad electrodes 430 and side electrodes 470 may be disposed in a second portion, a third portion, and/or a fourth portion of the peripheral region 20. The second portion may be opposite to the first portion, and the third and fourth portions may be located between the first portion and the second portion.

In example embodiments, each of the display region 10 and the peripheral region 20 illustrated in FIG. 1 has a shape of a tetragon. In embodiments, each of the display region 10 and the peripheral region 20 may have one or more of a shape of a triangle, a shape of a diamond, a shape of a polygon, a shape of a circle, a shape of an athletic track, a shape of an elliptic, etc.

Figure 6:
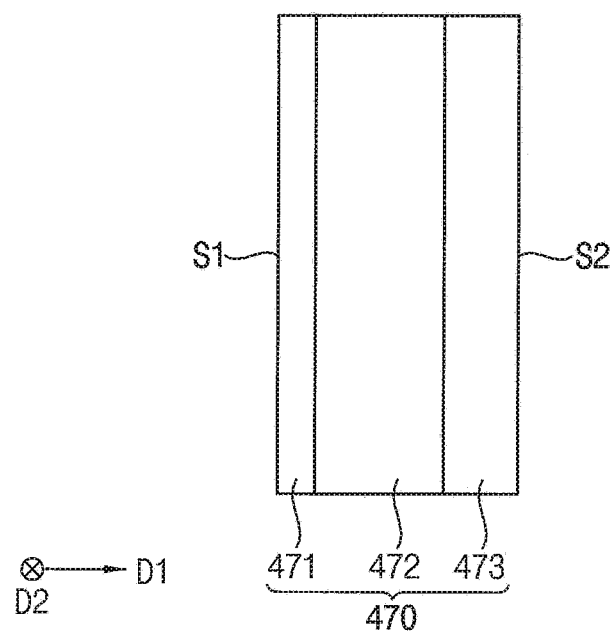
FIG. 6 is a cross-sectional view (or side view) illustrating a side electrode included in the OLED display device of FIG. 5 in accordance with example embodiments.

FIG. 5 is a cross-sectional view taken along a line I-I' of FIG. 1, and FIG. 6 is a cross-sectional view (or side view) illustrating a side electrode included in the OLED display device of FIG. 5.

Referring to FIGS. 5 and 6, the OLED display device 100 may include a lower substrate 110, a semiconductor element 250 (or transistor 250), a pad electrode 430, a planarization layer 270, a sub-pixel structure 200, a pixel defining layer 310, a seal member 390, an upper substrate 410, a side electrode 470, etc. The semiconductor element 250 may include an active layer 130, a gate insulation layer 150, a gate electrode 170, an insulating interlayer 190, a source electrode 210, and a drain electrode 230, and the sub-pixel structure 200 may include a lower electrode 290, a light emitting layer 330, and an upper electrode 340. The pad electrode 430 may include a first pad electrode pattern 431 and a second pad electrode pattern 432, and the side electrode 470 may include a first metal layer 471, a second metal layer 472, and a third metal layer 473.

The lower substrate 110 may include a display region 10 and the peripheral region 20. For example, a portion of an image may be displayed in the display region 10 through/by the sub-pixel structure 200 and the semiconductor element 250, and the lower substrate 110 and the upper substrate 410 may be sealed through/by the seal member 390 in the peripheral region 20.

The lower substrate 110 including transparent or opaque insulation materials may be provided. The lower substrate 110 may include/be at least one of a quartz substrate, a synthetic quartz substrate, a calcium fluoride substrate, a fluoride-doped quartz substrate, a soda-lime glass substrate, a non-alkali glass substrate etc.

The lower substrate 110 may include/be a flexible transparent substrate, such as a flexible transparent resin substrate (e.g., a polyimide substrate). The polyimide substrate may include a first polyimide layer, a barrier film layer, a second polyimide layer, etc. For example, the lower substrate 110 may have a structure in which the first polyimide layer, the barrier film layer, and the second polyimide layer are sequentially stacked on a rigid glass substrate. In a method of manufacturing the OLED display device 100, after an insulation layer (e.g., a buffer layer) is provided on the second polyimide layer of the polyimide substrate, an upper structure (e.g., the semiconductor element 250, the sub-pixel structure 200, etc.) may be formed on the insulation layer. After the upper structure is formed on the insulation layer, the rigid glass substrate on which the polyimide substrate is formed may be removed. It may be difficult to directly form the upper structure on the polyimide substrate because the polyimide substrate is relatively thin and flexible. The upper structure is formed on the polyimide substrate and the rigid glass substrate, and then the polyimide substrate may serve as the lower substrate 110 after the removal of the rigid glass substrate.

A buffer layer (not shown) may be disposed on the entire lower substrate 110. The buffer layer may prevent the diffusion of metal atoms and/or impurities from the lower substrate 110 into the semiconductor element 250 and the sub-pixel structure 200. In addition, the buffer layer may control a rate of a heat transfer in a crystallization process for forming the active layer 130, thereby obtaining substantially uniform the active layer 130. Further, the buffer layer may improve a surface flatness of the lower substrate 110 when a surface of the lower substrate 110 is relatively irregular. According to a type of the lower substrate 110, at least two buffer layers may be provided on the lower substrate 110, or the buffer layer might not be disposed. For example, the buffer layer may include organic materials or inorganic materials.

The active layer 130 may be disposed in the display region 10 on the lower substrate 110. The active layer 130 may include a metal oxide semiconductor, an inorganic semiconductor (e.g., amorphous silicon, polysilicon, etc.), or an organic semiconductor, etc.

The gate insulation layer 150 may be disposed on the active layer 130. The gate insulation layer 150 may cover the active layer 130 in the display region 10 on the lower substrate 110, and may be disposed in the entire display region 10 on the lower substrate 110. In example embodiments, the gate insulation layer 150 might not be disposed in the peripheral region 20 on the lower substrate 110. In some example embodiments, the gate insulation layer 150 may be disposed entirely in the display region 10 and the peripheral region 20 on the lower substrate 110. The gate insulation layer 150 may sufficiently cover the active layer 130 on the lower substrate 110, and may have a substantially flat upper surface without a step around the active layer 130. Alternatively, the gate insulation layer 150 may cover the active layer 130 on the lower substrate 110, and may be disposed as a substantially uniform thickness along a profile of the active layer 130. The gate insulation layer 150 may include silicon compound, metal oxide. For example, the gate insulation layer 150 may include at least one of silicon oxide (SiO), silicon nitride (SiN), silicon oxynitride (SiON), silicon oxycarbide (SiOC), silicon carbon nitride (SiCN), aluminum oxide (AlO), aluminum nitride (AlN), tantalum oxide (TaO), hafnium oxide (HfO), zirconium oxide (ZrO), titanium oxide (TiO), etc.

The gate electrode 170 may be disposed on a portion of the gate insulation layer 150 under which the active layer 130 is located. The gate electrode 170 may include at least one of a metal, a metal alloy, metal nitride, conductive metal oxide, transparent conductive materials, etc. These may be used alone or in a suitable combination. In some example embodiments, the first gate electrode 170 may have a multi-layered structure including a plurality of layers.

The first pad electrode pattern 431 may be disposed in the peripheral region 20 on the lower substrate 110. A first portion (e.g., one side surface) of the first pad electrode pattern 431 may be aligned/coplanar with an outmost surface of the OLED display device 100, and a second portion, which is opposite to the first portion, of the first pad electrode pattern 431 may extend from the peripheral region 20 into display region 10. For example, the second portion of the first pad electrode pattern 431 may be connected to one among a gate signal wire, a data signal wire, a power supply wire, a gate initialization signal wire, an initialization voltage wire, and a light emission signal wire. One among a gate signal, a data signal, a power supply, a gate initialization signal, an initialization voltage, and a light emission signal generated by the external device 101 may be provided to the sub-pixel structure 200 through an FPCB, the side electrode 470, the second pad electrode pattern 432, and the first pad electrode pattern 431. The first pad electrode pattern 431 may include at least one of a metal, an alloy, metal nitride, conductive metal oxide, transparent conductive material(s), etc. For example, the first pad electrode pattern 431 may include at least one of gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an alloy of aluminum, aluminum nitride (AlN), an alloy of silver, tungsten nitride (WN), an alloy of copper, an alloy of molybdenum, titanium nitride (TiN), chromium nitride (CrN), tantalum nitride (TaN), strontium ruthenium oxide (SRO), zinc oxide (ZnO), indium tin oxide (ITO), stannum oxide (SnO), indium oxide (InO), gallium oxide (GaO), indium zinc oxide (IZO), etc. These may be used alone or in a suitable combination. The first pad electrode pattern 431 may have a multi-layered structure including a plurality of layers.

The insulating interlayer 190 may be disposed on the gate electrode 170. The insulating interlayer 190 may cover the gate electrode 170 in the display region 10 on the gate insulation layer 150, and may be disposed on the entire gate insulation layer 150. In example embodiments, the insulating interlayer 190 might not be disposed in the peripheral region 20 on the lower substrate 110. In some example embodiments, the gate insulation layer 150 may be disposed entirely in the display region 10 and the peripheral region 20 on the lower substrate 110 except for a portion where the first pad electrode pattern 431 is in contact with the second pad electrode pattern 432. The insulating interlayer 190 may sufficiently cover the gate electrode 170 on the gate insulation layer 150, and may have a substantially flat upper surface without a step around the gate electrode 170. The insulating interlayer 190 may cover the gate electrode 170 on the gate insulation layer 150, and may be disposed as a substantially uniform thickness along a profile of the gate electrode 170. The insulating interlayer 190 may include silicon compound, metal oxide, etc.

The source electrode 210 and the drain electrode 230 may be disposed in the display region 10 on the insulating interlayer 190. The source electrode 210 may be connected to (or in direct contact with) a source region of the active layer 130 via a contact hole formed by removing a first portion of the gate insulation layer 150 and the insulating interlayer 190. The drain electrode 230 may be connected to a drain region of the active layer 130 via a contact hole formed by removing a second portion of the gate insulation layer 150 and the insulating interlayer 190. Each of the source electrode 210 and the drain electrode 230 may include at least one of a metal, an alloy, metal nitride, conductive metal oxide, transparent conductive material(s), etc. These may be used alone or in a suitable combination. Each of the source and drain electrodes 210 and 230 may have a multi-layered structure including a plurality of layers. The semiconductor element 250 may include the active layer 130, the gate insulation layer 150, the gate electrode 170, the insulating interlayer 190, the source electrode 210, and the drain electrode 230.

In example embodiments, the OLED display device 100 includes one transistor (e.g., the semiconductor element 250). In embodiments, the OLED display device 100 may include at least two semiconductor elements and at least one capacitor.

The semiconductor element 250 may have a top gate structure. The semiconductor element 250 may have a bottom gate structure and/or a double gate structure.

The second pad electrode pattern 432 may be disposed in the peripheral region 20 on the first pad electrode pattern 431. A first portion (e.g., one side surface) of the second pad electrode pattern 432 may be aligned/coplanar with an outmost surface of the OLED display device 100, and a second portion, which is opposite to the first portion, of the second pad electrode pattern 432 may be disposed within the seal member 390. Alternatively, the second portion of the second pad electrode pattern 432 may extend from the peripheral region 20 into the display region 10. The second pad electrode pattern 432 may include at least one of a metal, an alloy, metal nitride, conductive metal oxide, transparent conductive material(s), etc. These may be used alone or in a suitable combination. In example embodiments, the second pad electrode pattern 432, the source electrode 210, and the drain electrode 230 may be simultaneously formed using same materials. The second pad electrode pattern 432 may have a multi-layered structure including a plurality of layers. The pad electrode 430 may include the first pad electrode pattern 431 and the second pad electrode pattern 432. One side surface of the first pad electrode pattern 431 and one side surface of the second pad electrode pattern 432 may be defined as one side surface of the pad electrode 430.

The planarization layer 270 may be disposed in the display region 10 on the insulating interlayer 190, the source and drain electrodes 210 and 230. For example, the planarization layer 270 may be disposed as a high thickness to sufficiently cover the source and drain electrodes 210 and 230 on the insulating interlayer 190. The planarization layer 270 may have a substantially flat upper surface, and a planarization process may be further performed on the planarization layer 270 to implement the flat upper surface of the planarization layer 270. A portion of an upper surface of the drain electrode 230 may be exposed via a contact hole formed by removing a portion of the planarization layer 270. The planarization layer 270 may include organic materials or inorganic materials. In example embodiments, the planarization layer 270 may include one or more organic materials such as one or more of polyimide, epoxy-based resin, acryl-based resin, polyester, photoresist, polyacryl-based resin, polyimide-based resin, a polyamide-based resin, a siloxane-based resin, etc.

The lower electrode 290 may be disposed in the display region 10 on the planarization layer 270. The lower electrode 290 may be in direct contact with to the drain electrode 230 via the contact hole of the planarization layer 270, and may be electrically connected to the semiconductor element 250. The lower electrode 290 may include at least one of a metal, a metal alloy, metal nitride, conductive metal oxide, transparent conductive materials, etc. These may be used alone or in a suitable combination. The lower electrode 290 may have a multi-layered structure including a plurality of layers.

The pixel defining layer 310 may be disposed in the display region 10 on a portion of the lower electrode 290 and the planarization layer 270. The pixel defining layer 310 may cover both lateral portions of the lower electrode 290, and may expose a portion of an upper surface of the lower electrode 290. The pixel defining layer 310 may include organic materials or inorganic materials. In example embodiments, the pixel defining layer 310 may include organic materials.

The light emitting layer 330 may be disposed in the display region 10 on the lower electrode 290 exposed by the pixel defining layer 310. The light emitting layer 330 may be formed using at least one of light emitting materials capable of generating different colors of light (e.g., a red color of light, a blue color of light, and a green color of light, etc.) according to sub-pixel structures. In embodiments, the light emitting layer 330 may generally generate a white color of light by stacking a plurality of light emitting materials capable of generating different colors of light such as a red color of light, a green color of light, a blue color of light, etc. A color filter may be disposed on the light emitting layer 330 (e.g., to overlap the light emitting layer 330 in lower or upper surfaces of the upper substrate 410). The color filter may include at least one selected from a red color filter, a green color filter, and a blue color filter. Alternatively, the color filter may include a yellow color filter, a cyan color filter, and a magenta color filter. The color filter may include at least one of a photosensitive resin, a color photoresist, etc.

The upper electrode 340 may be disposed in the display region 10 on the pixel defining layer 310 and the light emitting layer 330. The upper electrode 340 may include at least one of a metal, a metal alloy, metal nitride, conductive metal oxide, transparent conductive material(s), etc. These may be used alone or in a suitable combination. The upper electrode 340 may have a multi-layered structure including a plurality of layers. The sub-pixel structure 200 may include the lower electrode 290, the light emitting layer 330, and the upper electrode 340.

The seal member 390 may be disposed in the peripheral region 20 on the pad electrode 430. The seal member 390 may be disposed in the peripheral region 20 between the lower substrate 110 and the upper substrate 410. An upper surface of the seal member 390 may be in direct contact with a lower surface of the upper substrate 410, and a lower surface of the seal member 390 may be in direct contact with a portion of the first pad electrode pattern 431 and the second pad electrode pattern 432. In example embodiments, a first portion (e.g., one side surface) of the seal member 390 may be aligned/coplanar with an outmost surface of the OLED display device 100, and a second portion, which is opposite to the first portion, of the seal member 390 may be disposed within the OLED display device 100. The seal member 390 may include frit, etc. The seal member 390 may additionally include a photo curable material. For example, the seal member 390 may include a compound such as the organic material and the photo curable material. After one or more of ultraviolet ray, laser beam, visible ray, etc. are irradiated in the compound, the compound may be cured, and thus the seal member 390 may be obtained. The photo curable material included in the seal member 390 may include at least one of epoxy acrylate-based resin, polyester acrylate-based resin, urethane acrylate based-resin, polybutadiene acrylate-based resin, silicon acrylate-based resin, alkyl acrylate-based resin, etc.

For example, a laser may be irradiated in the compound such as the organic material and the photo curable material. In response to an irradiation of the light of the laser, a state of the compound (e.g., the seal member 390) may be changed from a solid state to a liquid state. The compound of the liquid state may be cured to the solid state after a predetermined time. After the state change of the compound, the compound may seal the lower substrate 110 and the upper substrate 410.

In example embodiments, the seal member 390 has a tetragonal shape where a width of an upper surface is less than a width of a lower surface. For example, the seal member 390 may have at least one of a tetragonal shape where a width of an upper surface is greater than a width of a lower surface, a trapezoidal shape, a quadrate shape, etc.

The upper substrate 410 may be disposed on the seal member 390 and the upper electrode 340. The upper substrate 410 and the lower substrate 110 may include substantially same materials. For example, the upper substrate 410 may include/be at least one of a quartz substrate, a synthetic quartz substrate, a calcium fluoride substrate, a fluoride-doped quartz substrate, a soda-lime glass substrate, a non-alkali glass substrate, etc. In some example embodiments, the upper substrate 410 may include a transparent inorganic material or flexible plastic. For example, the upper substrate 410 may include/be a flexible transparent resin substrate. To increase flexibility of the OLED display device 100, the upper substrate 410 may have a stacked structure where at least one inorganic layer and at least one organic layer are alternately stacked. The stack structure may include a first inorganic layer, an organic layer, and a second inorganic layer. For example, the first inorganic layer having flexibility may be disposed along a profile of the upper electrode 340, and the organic layer having flexibility may be disposed on the first inorganic layer. The second inorganic layer having flexibility may be disposed on the organic layer. That is, the stack structure may correspond to a thin film encapsulation structure that is in direct contact with the upper electrode 340.

The side electrode 470 may be disposed in an outmost surface of the OLED display device 100. For example, one side surface of the lower substrate 110, one side surface of the upper substrate 410, one side surface of the pad electrode 430, and one side surface of the seal member 390 may directly contact a face of the side electrode 470. The side electrode 370 may be directly and electrically connected to the pad electrode 430. The side electrode 470 may protrude beyond/from one or more of the lower substrate 110, the pad electrode 430, the seal member 390 and the upper electrode 430 in the first direction D1.

As illustrated in FIG. 6, the side electrode 470 may have a first surface S1 and a second surface S2 opposite the first surface S1, and may include the first metal layer 471, the second metal layer 472, and the third metal layer 473. The first surface S1 may be in contact with the pad electrode 430, and the second surface S2 may be in direct contact with the FPCB. In embodiments, the side electrode 470 may include the first metal layer 471 and the second metal layer 472 without including the third metal layer 473.

The first metal layer 471 may be in contact with the pad electrode 430, and may include a metal having a relatively high metal adhesive force. For example, the first metal layer 471 may consist essentially of at least one of Ti, Mo, Ni, Ta, Nd, etc.

The second metal layer 472 may be disposed on the first metal layer 471, and may include a metal having a relatively low electrical resistance. For example, the second metal layer 472 may consist essentially of at least one of Au, Ag, Cu, Al, etc.

The third metal layer 473 may be disposed on the second metal layer 472, and may include a metal having a relatively high mechanical strength. The third metal layer 473 may protect the second metal layer 472. For example, the third metal layer 473 may consist essentially of at least one of Ti, Mo, an alloy of Ti, an alloy of Mo, etc. and may have a metal with a Mohs hardness of 5 or more. In a process for manufacturing the OLED display device 100, a space between the pad electrodes 430 may be relatively small, and an area of one side surface (e.g., a surface where the pad electrode 430 is in contact with side electrode 470) of the pad electrode 430 may be relatively small. The first metal layer 471 having a relatively high metal adhesive force may be in direct contact with one side surface of the corresponding pad electrode 430. To reduce electrical resistance of the side electrode 470, the second metal layer 472 having a relatively low electrical resistance may be disposed on the first metal layer 471. To protect the second metal layer 472 from external impacts, the third metal layer 473 having a relatively high mechanical strength may be disposed on the second metal layer 472.

As the OLED display device 100 includes the side electrode 470, an FPCB may be readily electrically connected to the pad electrode 430.

Figure 7:
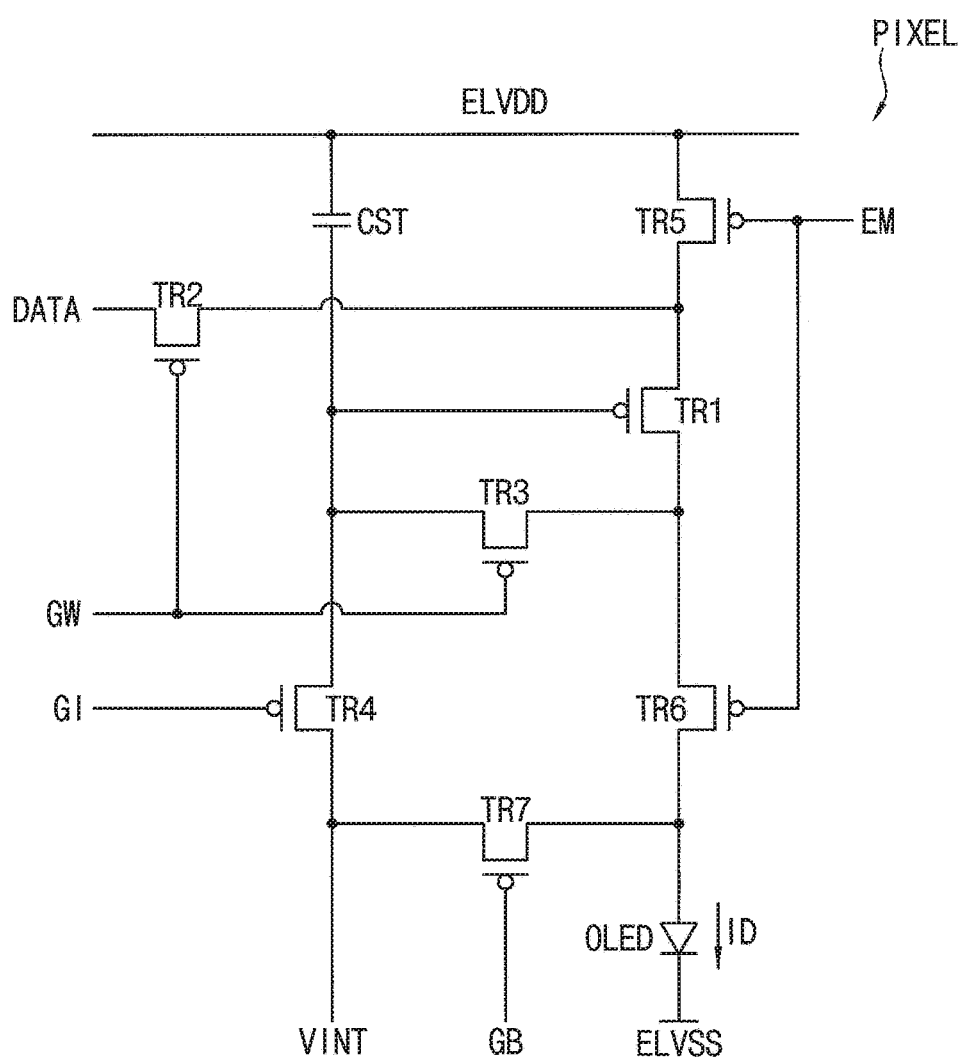
FIG. 7 is a circuit diagram illustrating an OLED and transistors that are included in the OLED display device of FIG. 1 in accordance with example embodiments.

FIG. 7 is a circuit diagram illustrating an OLED and transistors that are included in the OLED display device 100 of FIG. 1. For example, the OLED display device 100 may include a plurality of PIXELs, and each of the PIXELs may be represented by a circuit diagram illustrated in FIG. 7.

Referring to FIG. 7, an OLED display device 100 may include an OLED (e.g., corresponding to a sub-pixel structure 200 of FIG. 6), first, second, third, fourth, fifth, sixth, and seventh transistors TR1, TR2, TR3, TR4, TR5, TR6, and TR7, a storage capacitor CST, a gate signal GW wiring, a data signal DATA wiring, a high power supply ELVDD wiring, a low power supply ELVSS wiring, a gate initialization signal GI wiring, an initialization voltage VINT wiring, a light emission signal EM wiring, a diode initialization signal GB wiring, etc.

The OLED may emit light based on a driving current ID. The OLED may include a first terminal and a second terminal. In example embodiments, the second terminal of the OLED receives a low power supply ELVSS. The low power supply ELVSS may be generated from an external device 101, and may be provided to at least one side electrode 470 among a plurality of side electrodes 470 through an FPCB (refer to FIGS. 2, 4, and 6). That is, the low power supply ELVSS may be provided to the low power supply ELVSS wiring through the pad electrode 430 that is in contact with the side electrode 470, and the low power supply ELVSS applied to the low power supply ELVSS wiring may be provided to the second terminal of the OLED. For example, the first terminal of the OLED is an anode terminal, and the second terminal of the OLED is a cathode terminal. Alternatively, the first terminal of the OLED may be a cathode terminal, and the second terminal of the OLED may be an anode terminal. In example embodiments, the anode terminal of the OLED may correspond to a lower electrode 290 of FIG. 6, and the cathode terminal of the OLED may correspond to an upper electrode 340 of FIG. 6.

The first transistor TR1 may include a gate terminal, a first terminal, and a second terminal. In example embodiments, the first terminal of the first transistor TR1 is a source terminal, and the second terminal of the first transistor TR1 is a drain terminal. Alternatively, the first terminal of the first transistor TR1 may be a drain terminal, and the second terminal of the first transistor TR1 may be a source terminal.

The driving current ID may be generated by the first transistor TR1. In example embodiments, the first transistor TR1 operates in a saturation region. The first transistor TR1 may generate the driving current ID based on a voltage difference of the gate terminal and the source terminal, and a gradation may be implemented based on the amount of the driving current ID generated by the first transistor TR1. Alternatively, the first transistor TR1 operates in a linear region. In this case, a gradation may be implemented based on the amount of time during which the first transistor TR1 provides the driving current ID to the OLED within one frame.

The second transistor TR2 may include a gate terminal, a first terminal, and a second terminal. A gate signal GW may be applied to the gate terminal of the second transistor TR2. The first terminal of the second transistor TR2 may receive a data signal DATA. The data signal DATA may be generated from the external device 101, and may be provided to at least one side electrode 470 among a plurality of side electrodes 470 through the FPCB (referring to the descriptions associated with FIGS. 2, 4, and 6). The data signal DATA may be provided to the data signal DATA wiring through the pad electrode 430 that is in contact with the side electrode 470, and the data signal DATA applied to the data signal DATA wiring may be provided to the second transistor TR2. The second terminal of the second transistor TR2 may be connected to the first terminal of the first transistor TR1. In example embodiments, the first terminal of the second transistor TR2 is a source terminal, and the second terminal of the second transistor TR2 is a drain terminal. Alternatively, the first terminal of the second transistor TR2 may be a drain terminal, and the second terminal of the second transistor TR2 may be a source terminal.

The second transistor TR2 may provide the data signal DATA to the first terminal of the first transistor TR1 while the gate signal GW is activated. The second transistor TR2 operates in a linear region.

The third transistor TR3 may include a gate terminal, a first terminal, and a second terminal. The gate terminal of the third transistor TR3 may receive a gate signal GW. The first terminal of the third transistor TR3 may be connected to the gate terminal of the first transistor TR1. The second terminal of the third transistor TR3 may be connected to the second terminal of the first transistor TR1. For example, the gate signal GW may be generated from the external device 101 (or a gate driver), and the gate signal GW and may be provided to at least one side electrode 470 among a plurality of side electrodes 470 through the FPCB (refer to FIGS. 2, 4, and 6). The gate signal GW may be provided to the gate signal GW wiring through the pad electrode 430 that is in contact with the side electrode 470, and the gate signal GW applied to the gate signal GW wiring may be provided to a gate terminal of the third transistor TR3. In example embodiments, the first terminal of the third transistor TR3 is a source terminal, and the second terminal of the third transistor TR3 is a drain terminal. Alternatively, the first terminal of the third transistor TR3 may be a drain terminal, and the second terminal of the third transistor TR3 may be a source terminal.

The third transistor TR3 may connect the gate terminal of the first transistor TR1 to the second terminal of the first transistor TR1 while the gate signal GW is activated. The third transistor TR3 may operate in a linear region. The third transistor TR3 may form a diode connection of the first transistor TR1 while the gate signal GW is activated. A voltage difference, which corresponds to a threshold voltage of the first transistor TR1, between the first terminal of the first transistor TR1 and the gate terminal of the first transistor TR1 may occur due to the diode connection of the first transistor TR1. As a result, a sum voltage of the data signal DATA provided to the first terminal of the first transistor TR1 and the voltage difference (i.e., the threshold voltage) may be applied to the gate terminal of the first transistor TR1 while the gate signal GW is activated. The data signal DATA may be compensated as much as the threshold voltage of the first transistor TR1. The compensated data signal DATA may be applied to the gate terminal of the first transistor TR1. A uniformity of the driving current ID may be improved because of reducing an affect by the threshold voltage of the first transistor TR1.

An input terminal of the initialization voltage VINT wiring applied to an initialization voltage VINT is connected to a first terminal of the fourth transistor TR4 and a first terminal of the seventh transistor TR7, and an output terminal of the initialization voltage VINT wiring is connected to a second terminal of the fourth transistor TR4 and a first terminal of the storage capacitor CST. For example, the initialization voltage VINT may be generated from the external device 101, and the initialization voltage VINT and may be provided to at least one side electrode 470 among a plurality of side electrodes 470 through the FPCB (refer to FIGS. 2, 4, and 6). The initialization voltage VINT may be provided to the initialization voltage VINT wiring through the pad electrode 430 that is in contact with the side electrode 470, and the initialization voltage VINT applied to the initialization voltage VINT wiring may be provided to a first terminal of the fourth transistor TR4 and a first terminal of the seventh transistor TR7.

The fourth transistor TR4 may include a gate terminal, the first terminal, and the second terminal. The gate terminal of the fourth transistor TR4 may receive a gate initialization signal GI. For example, the gate initialization signal GI may be generated from the external device 101, and the gate initialization signal GI, and the gate initialization signal GI and may be provided to at least one side electrode 470 among a plurality of side electrodes 470 through the FPCB (refer to FIGS. 2, 4, and 6). The gate initialization signal GI may be provided to the gate initialization signal GI wiring through the pad electrode 430 that is in contact with the side electrode 470, and the gate initialization signal GI applied to the gate initialization signal GI wiring may be provided to a gate terminal of the fourth transistor TR4. In addition, the initialization voltage VINT may be applied to the first terminal of the fourth transistor TR4. The second terminal of the fourth transistor TR4 may be connected to the gate terminal of the first transistor TR1. In example embodiments, the first terminal of the fourth transistor TR4 is a source terminal, and the second terminal of the fourth transistor TR4 is a drain terminal. Alternatively, the first terminal of the fourth transistor TR4 may be a drain terminal, and the second terminal of the fourth transistor TR4 may be a source terminal.

The fourth transistor TR4 may apply the initialization voltage VINT to the gate terminal of the first transistor TR1 while the gate initialization signal GI is activated. The fourth transistor TR4 may operate in the linear region. The fourth transistor TR4 may initialize the gate terminal of the first transistor TR1 as the initialization voltage VINT while the gate initialization signal GI is activated. In example embodiments, a voltage level of the initialization voltage VINT is sufficiently lower than a voltage level of the data signal DATA maintained by the storage capacitor CST in a previous frame. The initialization voltage VINT may be applied to the gate terminal of the first transistor TR1 that is a P-channel metal oxide semiconductor (PMOS) type transistor. In some example embodiments, a voltage level of the initialization voltage VINT is sufficiently higher than the voltage level of the data signal DATA maintained by the storage capacitor CST in a previous frame. The initialization voltage VINT may be applied to the gate terminal of the first transistor TR1 that is an N-channel metal oxide semiconductor (NMOS) type transistor.

In example embodiments, the gate initialization signal GI is identical to the gate signal GW advanced by one horizontal time period. For example, the gate initialization signal GI that is applied to a PIXEL located in a (n)th row among a plurality of PIXELs included in the OLED display device 100 (where n is an integer of 2 or more) may be substantially a same as the gate signal GW that is applied to a PIXEL located in a (n−1)th row among a plurality of the PIXELs. The gate initialization signal GI that is activated may be applied to the PIXEL located in the (n)th row among the PIXELs by applying the gate signal GW that is activated to the PIXEL located in the (n−1)th row among the PIXELs. As a result, the gate terminal of the first transistor TR1 included in the PIXEL located in the (n)th row among the PIXELs may be initialized as the initialization voltage VINT when the data signal DATA is applied to the PIXEL located in the (n−1)th row among the PIXELs.

The fifth transistor TR5 may include a gate terminal, a first terminal, and a second terminal. The light emission signal EM may be applied to the gate terminal of the fifth transistor TR5. The high power supply ELVDD may be applied to the first terminal of the fifth transistor TR5. The second terminal of the fifth transistor TR5 may be connected to the first terminal of the first transistor TR1.

The fifth transistor TR5 may apply the high power supply ELVDD to the first terminal of the first transistor TR1 while the light emission signal EM is activated. On the other hand, the fifth transistor TR5 does not apply the high power supply ELVDD while the light emission signal EM is inactivated. The fifth transistor TR5 may operate in the linear region. The fifth transistor TR5 may apply the high power supply ELVDD to the first terminal of the first transistor TR1 while the light emission signal EM is activated, such that the first transistor TR1 generates the driving current ID. In addition, the fifth transistor TR5 does not apply the high power supply ELVDD while the light emission signal EM is inactivated, such that the data signal DATA applied to the first terminal of the first transistor TR1 is applied to the gate terminal of the first transistor TR1. The high power supply ELVDD may be generated from the external device 101, and the gate signal GW and may be provided to at least one side electrode 470 among a plurality of side electrodes 470 through the FPCB (refer to FIGS. 2, 4, and 6). The high power supply ELVDD may be provided to the high power supply ELVDD wiring through the pad electrode 430 that is in contact with the side electrode 470, and the high power supply ELVDD applied to the high power supply ELVDD wiring may be provided to a first terminal of the fifth transistor TR5. In example embodiments, the first terminal of the fifth transistor TR5 is a source terminal, and the second terminal of the fifth transistor TR5 is a drain terminal. Alternatively, the first terminal of the fifth transistor TR5 may be a drain terminal, and the second terminal of the fifth transistor TR5 may be a source terminal.

The sixth transistor TR6 (e.g., a semiconductor element 250 of FIG. 6) may include a gate terminal, a first terminal, and a second terminal. The light emission signal EM may be applied to the gate terminal of the sixth transistor TR6. The first terminal of the sixth transistor TR6 may be connected to the second terminal of the first transistor TR1. The second terminal of the sixth transistor TR6 may be connected to the first terminal of the OLED. The light emission signal EM may be generated from the external device 101 (or a gate driver), and the light emission signal EM and may be provided to at least one side electrode 470 among a plurality of side electrodes 470 through the FPCB (refer to FIGS. 2, 4, and 6). The light emission signal EM may be provided to the light emission signal EM wiring through the pad electrode 430 that is in contact with the side electrode 470, and the light emission signal EM applied to the light emission signal EM wiring may be provided to a gate terminal of the fifth transistor TR5 and a gate terminal of the sixth transistor TR6. In example embodiments, the first terminal of the sixth transistor TR6 is a source terminal, and the second terminal of the sixth transistor TR6 is a drain terminal. In some example embodiments, the first terminal of the sixth transistor TR6 may be a drain terminal, and the second terminal of the sixth transistor TR6 may be a source terminal.

The sixth transistor TR6 may provide the driving current ID generated by the first transistor TR1 to the OLED while the light emission signal EM is activated. The sixth transistor TR6 may operate in the linear region. The sixth transistor TR6 may provide the driving current ID generated by the first transistor TR1 to the OLED while the light emission signal EM is activated, such that the OLED emits light. In addition, the sixth transistor TR6 may electrically disconnect the first transistor TR1 from the OLED while the light emission signal EM is inactivated, such that the compensated data signal DATA applied to the second terminal of the first transistor TR1 is applied to the gate terminal of the first transistor TR1.

The seventh transistor TR7 may include a gate terminal, a first terminal, and a second terminal. The diode initialization signal GB may be applied to the gate terminal of the seventh transistor TR7. The initialization voltage VINT may be applied to the first terminal of the seventh transistor TR7. The second terminal of the seventh transistor TR7 may be connected to the first terminal of the OLED. In example embodiments, the first terminal of the seventh transistor TR7 is a source terminal, and the second terminal of the seventh transistor TR7 is a drain terminal. Alternatively, the first terminal of the seventh transistor TR7 may be a drain terminal, and the second terminal of the seventh transistor TR7 may be a source terminal.

The seventh transistor TR7 may apply the initialization voltage VINT to the first terminal of the OLED while the diode initialization signal GB is activated. The seventh transistor TR7 may operate in the linear region. The seventh transistor TR7 may initialize the first terminal of the OLED as the initialization voltage VINT while the diode initialization signal GB is activated.

Alternatively, the gate initialization signal GI and the diode initialization signal GB are a substantially same signal. An initialization operation of the gate terminal of the first transistor TR1 might not affect an initialization operation of the first terminal of the OLED. The initialization operation of the gate terminal of the first transistor TR1 and the initialization operation of the first terminal of the OLED may be independent to each other. Therefore, the gate initialization signal GI is used as the diode initialization signal GB, thereby improving the manufacturing efficiency.

The storage capacitor CST may include the first terminal and the second terminal, and may be connected between the high power supply ELVDD wiring and the gate terminal of the first transistor TR1. For example, the first terminal of the storage capacitor CST may be connected to the gate terminal of the first transistor TR1, and the second terminal of the storage capacitor CST may be connected to the high power supply ELVDD wiring. The storage capacitor CST may maintain a voltage level of the gate terminal of the first transistor TR1 while the gate signal GW is inactivated. The light emission signal EM may be activated while the gate signal GW is inactivated (e.g., a section where the gate signal GW is inactivated may include a section where the light emission signal EM is activated). The driving current ID generated by the first transistor TR1 may be provided to the OLED while the emission signal EM is activated. Therefore, the driving current ID generated by the first transistor TR1 may be provided to the OLED based on the voltage level maintained by the storage capacitor CST.

Figure 8:
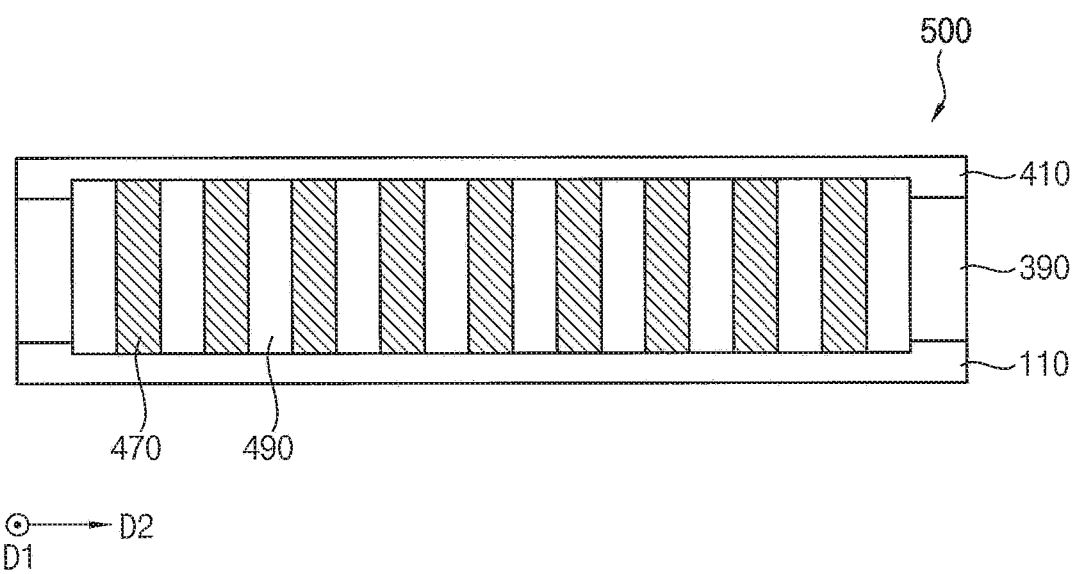
FIG. 8 is a lateral view illustrating an OLED display device in accordance with example embodiments.

FIG. 8 is a lateral view illustrating an OLED display device in accordance with example embodiments. An OLED display device 500 illustrated in FIG. 8 may have a configuration substantially the same as or similar to that of an OLED display device 100 described with reference to FIGS. 1 through 7 except for organic patterns 490 (or organic members 490). In FIG. 8, detailed descriptions for elements that are substantially the same as or similar to elements described with reference to FIGS. 1 through 7 may not be repeated.

Referring FIGS. 1 through 7 and 8, an OLED display device 500 may include a lower substrate 110, a semiconductor element 250, pad electrodes 430, a planarization layer 270, a sub-pixel structure 200, a pixel defining layer 310, a seal member 390, an upper substrate 410, side electrodes 470, organic patterns 490, etc.

The pad electrodes 430 may include first through (n)th pad electrodes (where n is an integer more than 2), and the first through (n)th pad electrodes may be spaced apart from each other, and are arranged along a second direction D2 in the peripheral region 20. The side electrodes 470 may include first through (m)th side electrodes (where m is an integer more than 2), and the first through (m)th side electrodes may be in direct contact with the first through (n)th pad electrodes, respectively, wherein m may be equal to n. The organic patterns 490 may include first through (p)th organic patterns (where p is an integer more than 1), and a (k)th organic pattern among the first through (p)th organic patterns may be disposed between (h)th and (h+1)th side electrodes among the first through (m)th side electrodes, where k is an integer between 1 and p, and h is an integer between 1 and m.

After an organic layer is formed entirely in an outmost surface of the OLED display device 500, the organic patterns 490 may be formed by patterning the organic layer. The organic patterns 490 may expose the pad electrode 430. A metal layer may be formed on the outmost surface of the OLED display device 500 and the organic patterns 490. After the metal layer is formed, the side electrodes 470 may be formed by patterning the metal layer. The organic patterns 490 may include at least one of polyimide, siloxane, etc.

Figure 9:
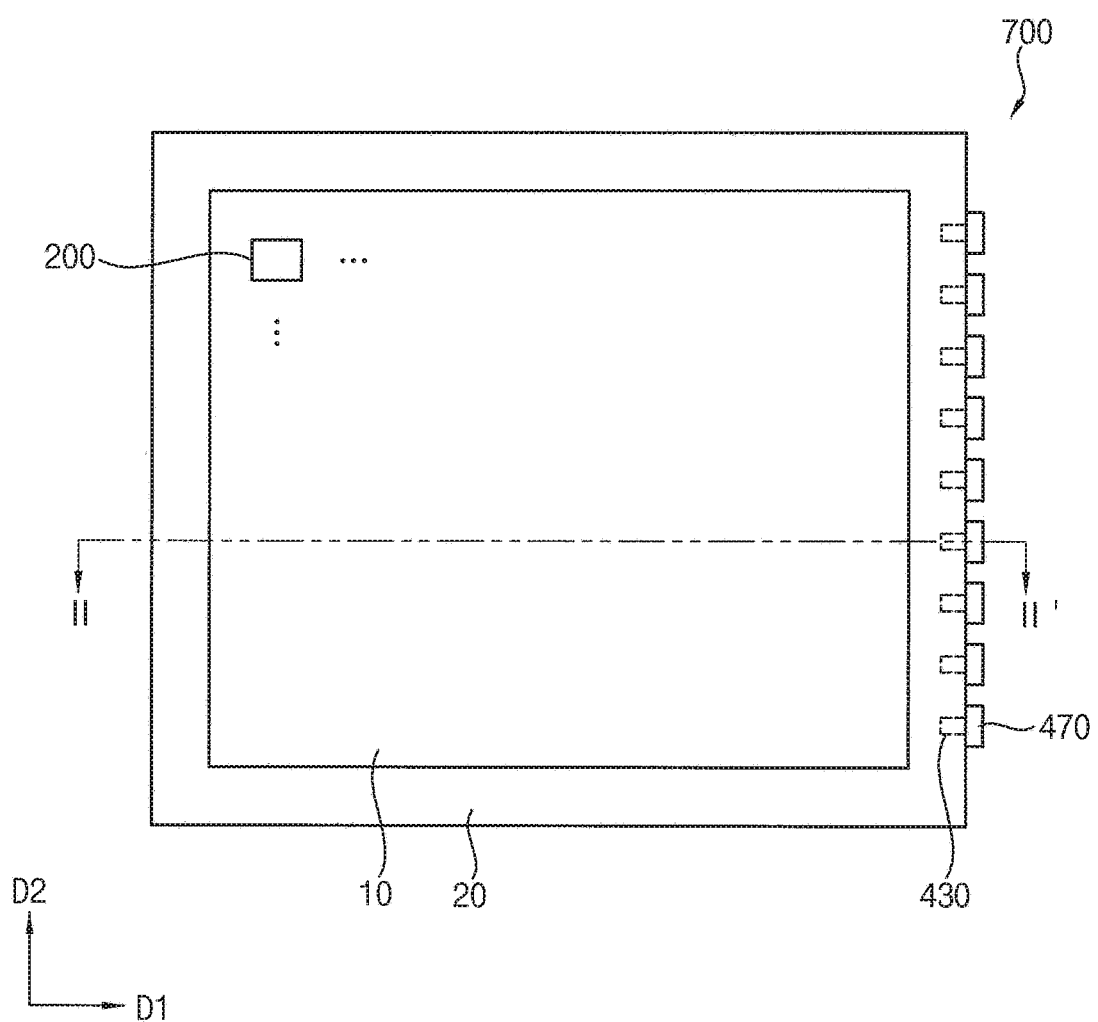
FIG. 9 is a plan view illustrating an OLED display device in accordance with example embodiments.
Figure 10:
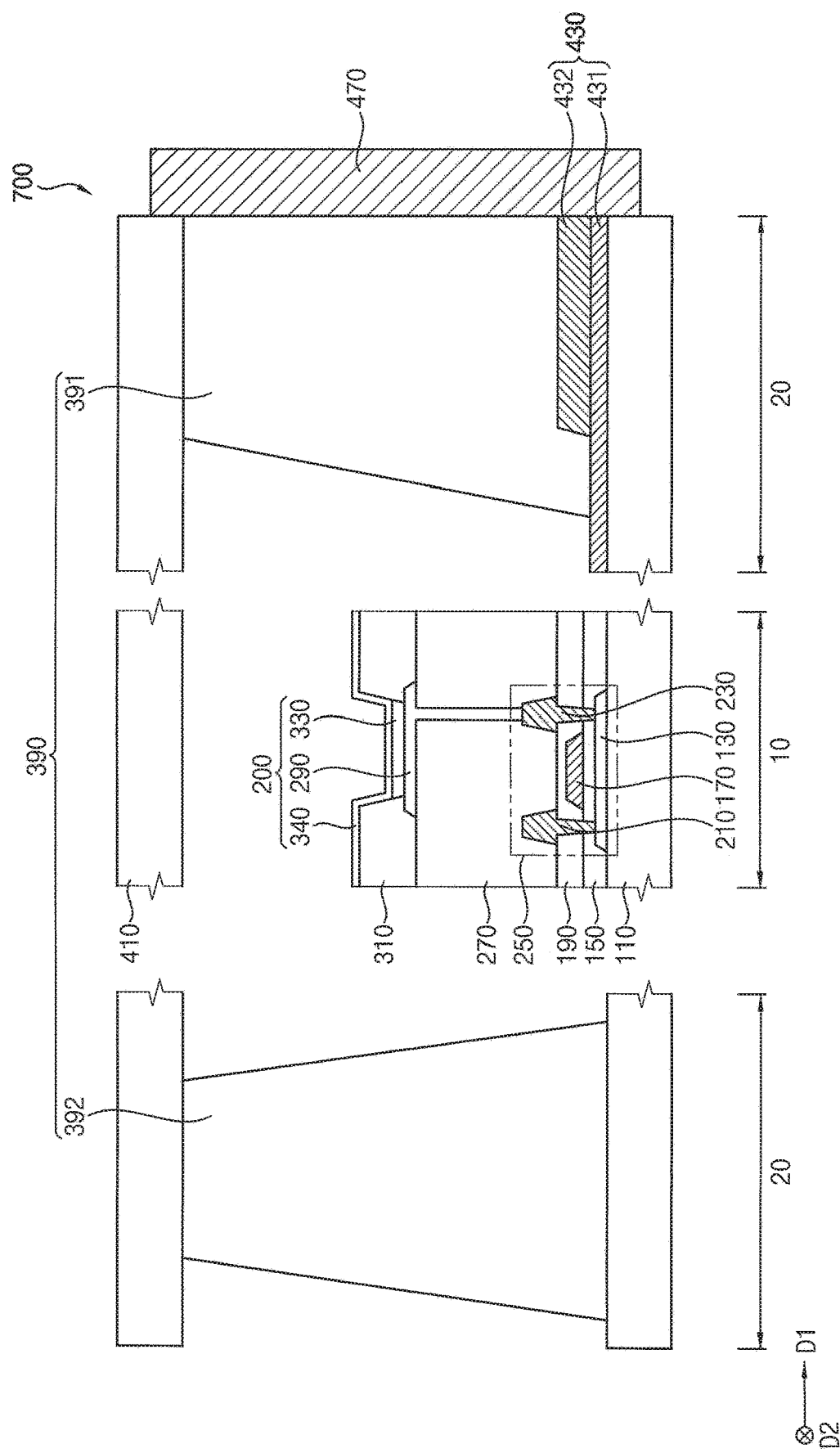
FIG. 10 is a cross-sectional view taken along a line II-II' of FIG. 9 in accordance with example embodiments.

FIG. 9 is a plan view illustrating an OLED display device in accordance with example embodiments, and FIG. 10 is a cross-sectional view taken along a line II-II' of FIG. 9. An OLED display device 700 illustrated in FIGS. 9 and 10 may have elements substantially the same as or similar to elements of an OLED display device 100 described with reference to FIGS. 1 through 7 except for a shape of the seal member 390. In FIGS. 9 and 10, detailed descriptions for elements that are substantially the same as or similar to elements described with reference to FIGS. 1 through 7 may not be repeated.

Referring to FIGS. 9 and 10, an OLED display device 700 may include a lower substrate 110, a semiconductor element 250, a pad electrode 430, a planarization layer 270, a sub-pixel structure 200, a pixel defining layer 310, a seal member 390, an upper substrate 410, a side electrode 470, etc. The seal member 390 may include a first seal pattern 391 and a second seal pattern 392. The pad electrode 430 may include a first pad electrode pattern 431 and a second pad electrode pattern 432, and the side electrode 470 may include a first metal layer 471, a second metal layer 472, and a third metal layer 473.

The seal member 390 may be disposed in the peripheral region 20 on the lower substrate 110. For example, a portion where the pad electrode 430 is disposed in the peripheral region 20 is defined as a first peripheral region, and a portion where the pad electrode 430 is not disposed in the peripheral region 20 is defined as a second peripheral region.

As illustrated in FIG. 10, the peripheral region 20 illustrated in a right of the display region 10 may correspond to the first peripheral region, and the peripheral region 20 illustrated in a left of the display region 10 may correspond to the second peripheral region. In example embodiments, the first seal pattern 391 (or first seal member/section 391) may be disposed in the first peripheral region on the lower substrate 110, and the second seal pattern 392 (or second seal member/section 392) may be disposed in the second peripheral region on the lower substrate 110. The first seal pattern 391 may be in contact with the pad electrode 430 and the side electrode 470, and a shape of an cross section of the first seal pattern 391 may be different from a shape of a cross section of the second seal pattern 392. For example, a portion of the upper substrate 410, a portion of the lower substrate 110, and a portion of the side electrode 470 that are located in the first peripheral region may be removed such that the side electrode 470 is contact with the pad electrode 430, and an outmost portion of the first seal pattern 391 may have a plan side surface. Meanwhile, an outmost portion of the second seal pattern 392 may have a slope side surface. Side surfaces of the first seal pattern 391 might not be symmetrical, and side surfaces of the second seal pattern 392 may be symmetrical.

Figure 15:
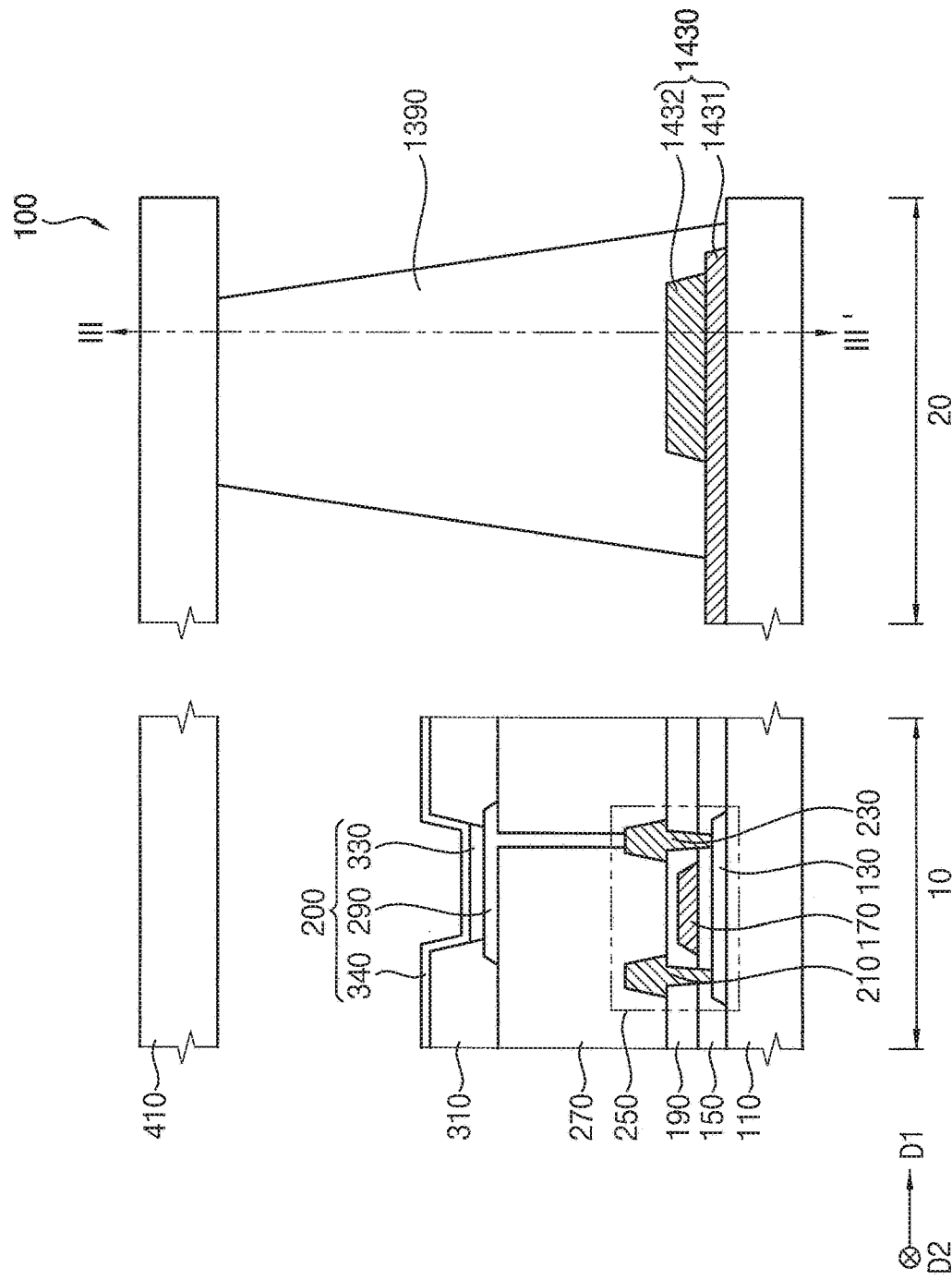
Figure 16:
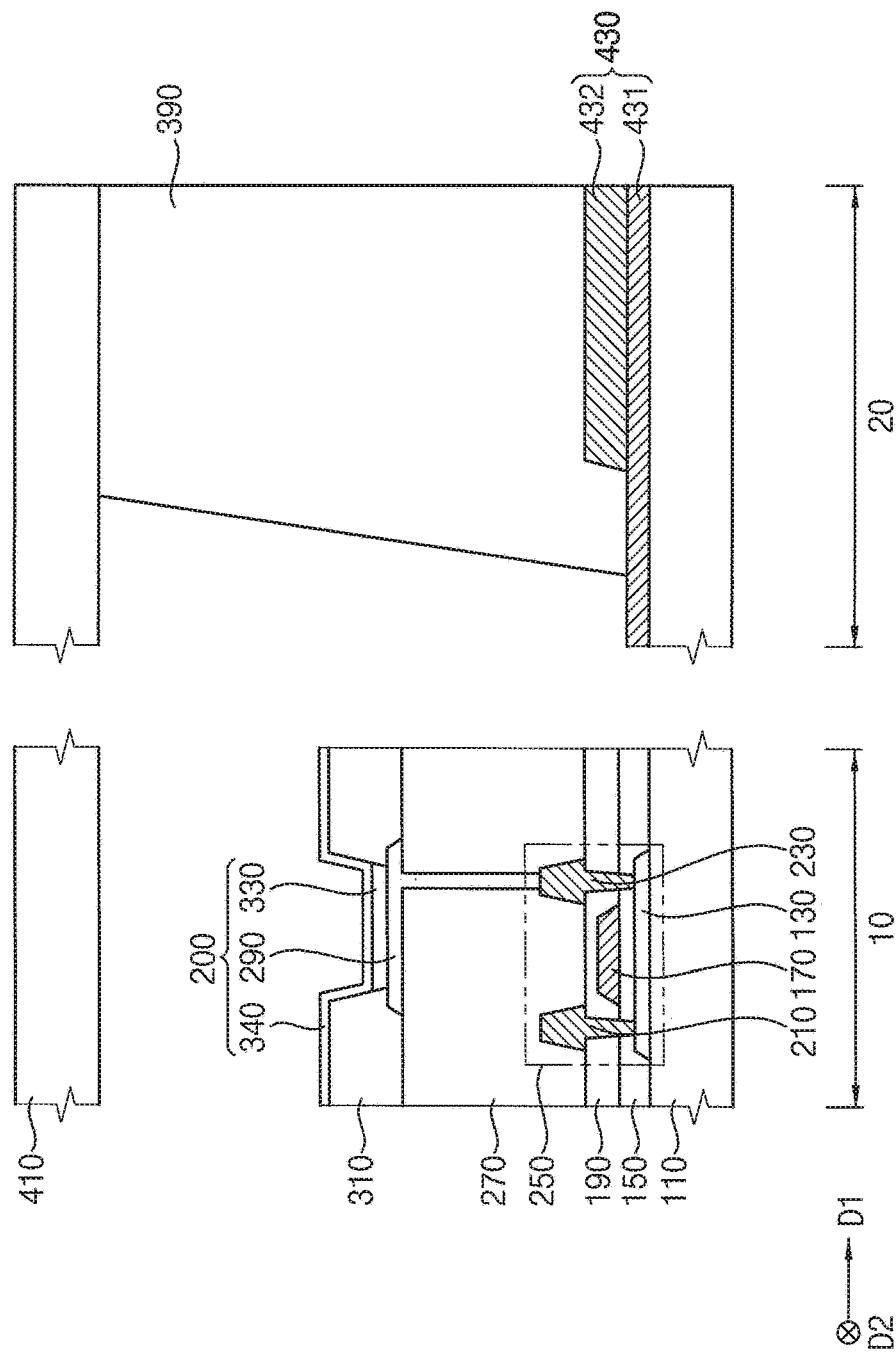
Figure 17:
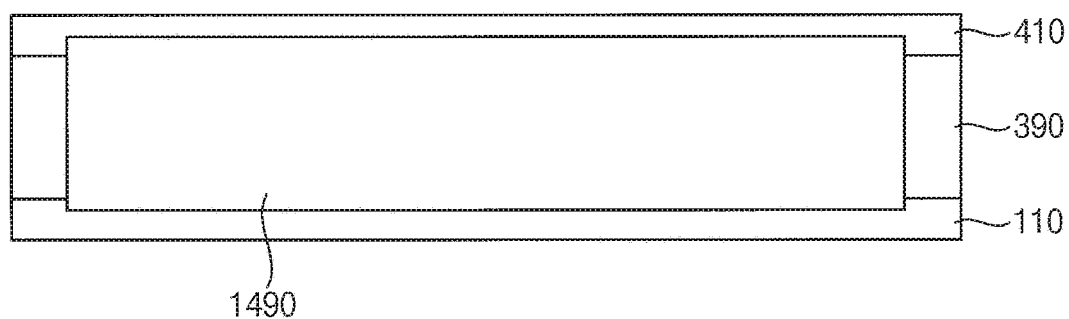
Figure 18:
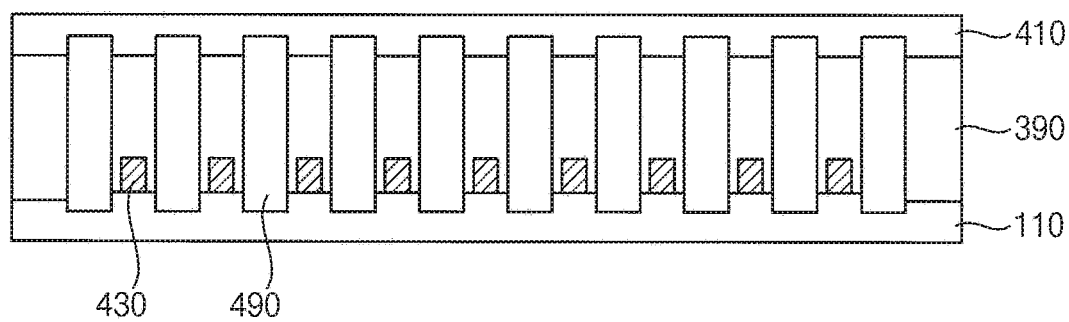
Figure 19:
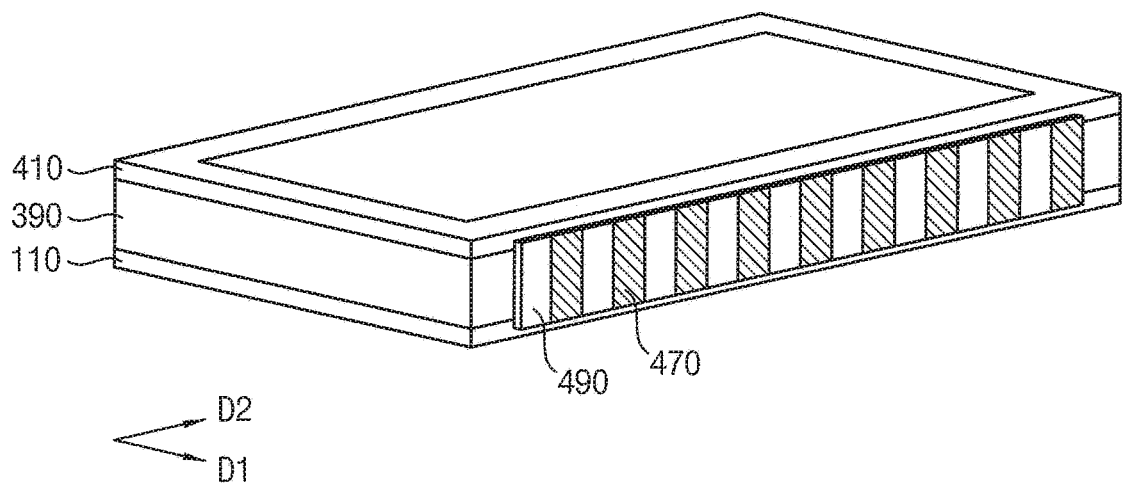

FIGS. 11 through 19 are diagrams illustrating structures formed in a method of manufacturing an OLED display device in accordance with example embodiments. For example, FIGS. 11 through 16 are cross-sectional views corresponding to an OLED display device, and FIGS. 17 and 18 are lateral views corresponding to an OLED display device. In addition, FIG. 19 is a perspective view corresponding to an OLED display device.

Figure 11:
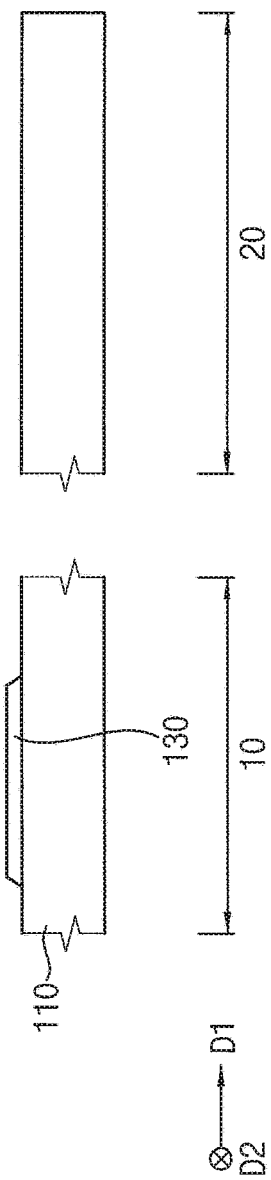
FIG. 11, FIG. 12, FIG. 13, FIG. 14, FIG. 15, FIG. 16, FIG. 17, FIG. 18, and FIG. 19 are diagrams illustrating structures formed in a method of manufacturing an OLED display device in accordance with example embodiments.

Referring to FIG. 11, a lower substrate 110 including transparent or opaque insulation materials may be provided. The lower substrate 110 may be formed using at least one of a quartz substrate, a synthetic quartz substrate, a calcium fluoride substrate, a fluoride-doped quartz substrate, a soda-lime glass substrate, a non-alkali glass substrate, etc. Alternatively or additionally, the lower substrate 110 may be formed using a flexible transparent material.

A buffer layer (not shown) may be formed on the entire lower substrate 110. The buffer layer may prevent the diffusion of metal atoms and/or impurities from the lower substrate 110. The buffer layer may control a rate of a heat transfer in a crystallization process for forming an active layer, thereby obtaining substantially uniform the active layer. Further, the buffer layer may improve a surface flatness of the lower substrate 110 when a surface of the lower substrate 110 is relatively irregular. According to a type of the lower substrate 110, at least two buffer layers may be provided on the lower substrate 110, or the buffer layer might not be formed. For example, the buffer layer may be formed using organic materials or inorganic materials.

Figure 12:
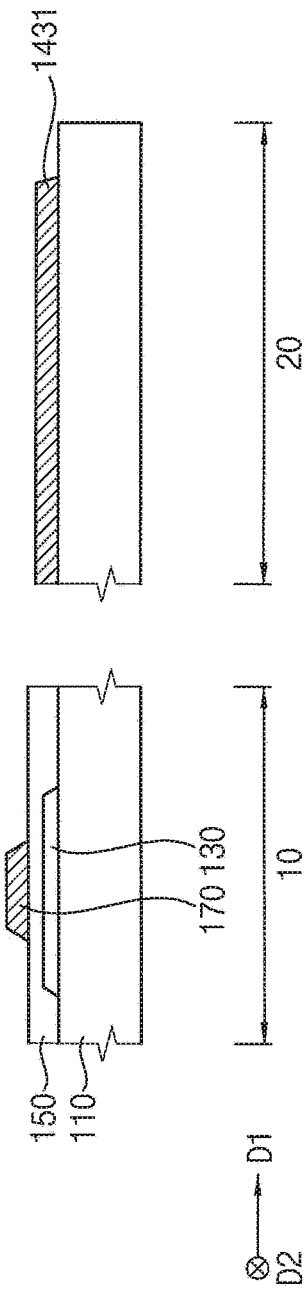

Referring to FIG. 12, a gate insulation layer 150 may be formed on the active layer 130. The gate insulation layer 150 may cover the active layer 130 in the display region 10 on the lower substrate 110, and may be formed in the entire display region 10 on the lower substrate 110. In example embodiments, the gate insulation layer 150 might not be formed in the peripheral region 20 on the lower substrate 110. In some example embodiments, the gate insulation layer 150 may be formed entirely in the display region 10 and the peripheral region 20 on the lower substrate 110. The gate insulation layer 150 may sufficiently cover the active layer 130 on the lower substrate 110, and may have a substantially flat upper surface without a step around the active layer 130. The gate insulation layer 150 may cover the active layer 130 on the lower substrate 110, and may be formed as a substantially uniform thickness along a profile of the active layer 130. The gate insulation layer 150 may include at least one of silicon compound, metal oxide, etc. The gate insulation layer 150 may be formed using at least one of SiO, SiN, SiON, SiOC, SiCN, AlO, AlN, TaO, HfO, ZrO, TiO, etc.

A gate electrode 170 may be formed on a portion of the gate insulation layer 150 and may overlap the active layer 130. The gate electrode 170 may be formed using at least one of a metal, a metal alloy, metal nitride, conductive metal oxide, transparent conductive materials, etc. These may be used alone or in a suitable combination. The first gate electrode 170 may have a multi-layered structure including a plurality of layers.

A preliminary first pad electrode pattern 1431 may be formed in the peripheral region 20 on the lower substrate 110. The preliminary first pad electrode pattern 1431 may be formed using a metal, an alloy, metal nitride, conductive metal oxide, transparent conductive materials, etc. For example, the preliminary first pad electrode pattern 1431 may include Au, Ag, Al, Pt, Ni, Ti, Pd, Mg, Ca, Li, Cr, Ta, W, Cu, Mo, Sc, Nd, Ir, an alloy of aluminum, AlN, an alloy of silver, WN, an alloy of copper, an alloy of molybdenum, TiN, CrN, TaN, SRO, ZnO, ITO, SnO, InO, GaO, IZO, etc. These may be used alone or in a suitable combination. In example embodiments, the preliminary first pad electrode pattern 1431 and the gate electrode 170 may be simultaneously formed using same materials. For example, after the preliminary first electrode layer is formed on the entire lower substrate 110, the gate electrode 170 and the preliminary first pad electrode pattern 1431 may be simultaneously formed by selectively etching the preliminary first electrode layer. The preliminary first pad electrode pattern 1431 may have a multi-layered structure including a plurality of layers.

Figure 13:
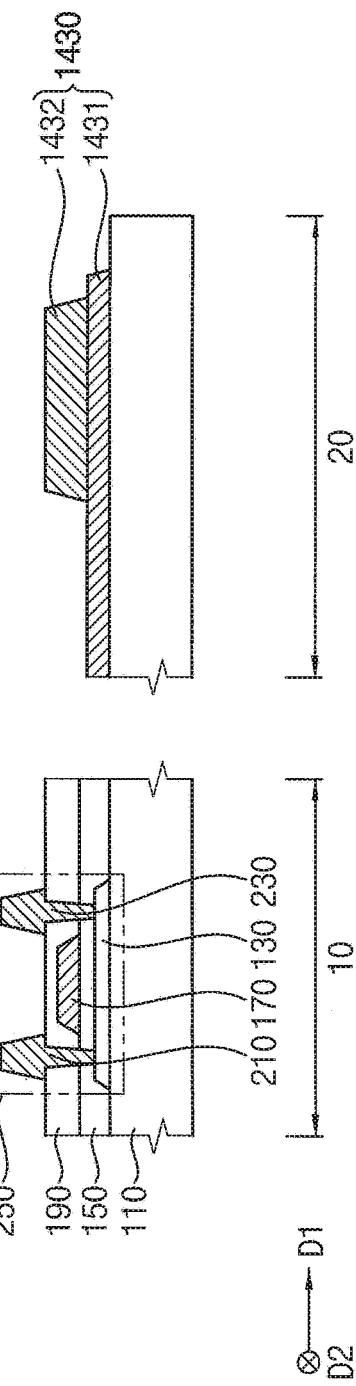

Referring to FIG. 13, an insulating interlayer 190 may be formed on the gate electrode 170. The insulating interlayer 190 may cover the gate electrode 170 in the display region 10 on the gate insulation layer 150, and may be formed on the entire gate insulation layer 150. In example embodiments, the insulating interlayer 190 might not be formed in the peripheral region 20 on the lower substrate 110. In some example embodiments, the gate insulation layer 150 may be formed entirely in the display region 10 and the peripheral region 20 on the lower substrate 110 except for a portion where the preliminary first pad electrode pattern 1431 is formed. The insulating interlayer 190 may sufficiently cover the gate electrode 170 on the gate insulation layer 150, and may have a substantially flat upper surface without a step around the gate electrode 170. The insulating interlayer 190 may cover the gate electrode 170 on the gate insulation layer 150, and may be formed as a substantially uniform thickness along a profile of the gate electrode 170. The insulating interlayer 190 may be formed using silicon compound, metal oxide, etc.

A source electrode 210 and a drain electrode 230 may be formed in the display region 10 on the insulating interlayer 190. The source electrode 210 may be in direct contact with a source region of the active layer 130 via a contact hole formed by removing a first portion of the gate insulation layer 150 and the insulating interlayer 190. The drain electrode 230 may be in direct contact with a drain region of the active layer 130 via a contact hole formed by removing a second portion of the gate insulation layer 150 and the insulating interlayer 190. Each of the source electrode 210 and the drain electrode 230 may be formed using a metal, an alloy, metal nitride, conductive metal oxide, transparent conductive materials, etc. These may be used alone or in a suitable combination. Each of the source and drain electrodes 210 and 230 may have a multi-layered structure including a plurality of layers. Accordingly, a semiconductor element 250 including the active layer 130, the gate insulation layer 150, the gate electrode 170, the insulating interlayer 190, the source electrode 210, and the drain electrode 230 may be formed.

A preliminary second pad electrode pattern 1432 may be formed in the peripheral region 20 on the preliminary first pad electrode pattern 1431. The preliminary second pad electrode pattern 1432 may be formed using a metal, an alloy, metal nitride, conductive metal oxide, transparent conductive materials, etc. These may be used alone or in a suitable combination. In example embodiments, the preliminary second pad electrode pattern 1432, the source electrode 210, and the drain electrode 230 may be simultaneously formed using same materials. For example, after the preliminary second electrode layer is formed on the lower substrate 110, the preliminary second pad electrode pattern 1432, the source electrode 210, and the drain electrode 230 may be simultaneously formed by selectively etching the preliminary second electrode layer. The preliminary second pad electrode pattern 1432 may have a multi-layered structure including a plurality of layers. Accordingly, a preliminary pad electrode 1430 including the preliminary first pad electrode pattern 1431 and the preliminary second pad electrode pattern 1432 may be formed.

Figure 14:
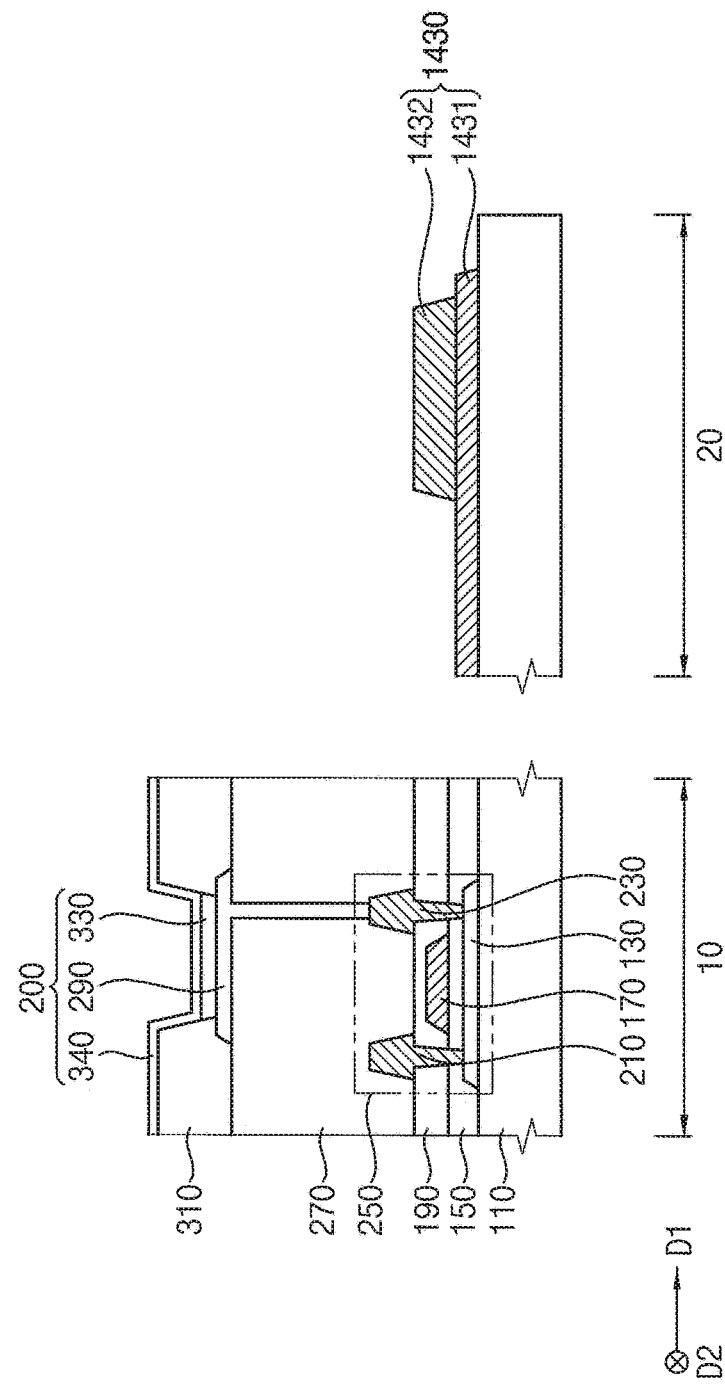

Referring to FIG. 14, a planarization layer 270 may be formed in the display region 10 on the insulating interlayer 190, the source and drain electrodes 210 and 230. The planarization layer 270 may have a sufficient thickness to sufficiently cover the source and drain electrodes 210 and 230 on the insulating interlayer 190. The planarization layer 270 may have a substantially flat upper surface, and a planarization process may be further performed on the planarization layer 270 to implement the flat upper surface of the planarization layer 270. A portion of an upper surface of the drain electrode 230 may be exposed via a contact hole formed by removing a portion of the planarization layer 270. The planarization layer 270 may include organic materials or inorganic materials. In example embodiments, the planarization layer 270 may be formed using organic materials such as polyimide, epoxy-based resin, acryl-based resin, polyester, photoresist, polyacryl-based resin, polyimide-based resin, a polyamide-based resin, a siloxane-based resin, etc.

A lower electrode 290 may be formed in the display region 10 on the planarization layer 270. The lower electrode 290 may be in direct contact with to the drain electrode 230 via the contact hole of the planarization layer 270, and may be electrically connected to the semiconductor element 250. The lower electrode 290 may be formed using a metal, a metal alloy, metal nitride, conductive metal oxide, transparent conductive materials, etc. These may be used alone or in a suitable combination. The lower electrode 290 may have a multi-layered structure including a plurality of layers.

A pixel defining layer 310 may be formed in the display region 10 on a portion of the lower electrode 290 and the planarization layer 270. The pixel defining layer 310 may cover both lateral portions of the lower electrode 290, and may expose a portion of an upper surface of the lower electrode 290. The pixel defining layer 310 may include organic materials or inorganic materials. In example embodiments, the pixel defining layer 310 may be formed using organic materials.

A light emitting layer 330 may be formed in the display region 10 on the lower electrode 290 exposed by the pixel defining layer 310. The light emitting layer 330 may be formed using at least one of light emitting materials capable of generating different colors of light (e.g., a red color of light, a blue color of light, and a green color of light, etc.) according to sub-pixel structures. The light emitting layer 330 may generally generate a white color of light by stacking a plurality of light emitting materials capable of generating different colors of light such as a red color of light, a green color of light, a blue color of light, etc. In this case, a color filter may be formed on the light emitting layer 330. The color filter may include at least one selected from a red color filter, a green color filter, and a blue color filter. The color filter may include a yellow color filter, a cyan color filter, and a magenta color filter. The color filter may be formed using a photosensitive resin, color photoresist, etc.

An upper electrode 340 may be formed in the display region 10 on the pixel defining layer 310 and the light emitting layer 330. The upper electrode 340 may be formed using a metal, a metal alloy, metal nitride, conductive metal oxide, transparent conductive materials, etc. These may be used alone or in a suitable combination. The upper electrode 340 may have a multi-layered structure including a plurality of layers. Accordingly, a sub-pixel structure 200 including the lower electrode 290, the light emitting layer 330, and the upper electrode 340 may be formed.

Referring to FIG. 15, a preliminary seal member 1390 may be formed in the peripheral region 20 on the preliminary pad electrode 1430. A lower surface of the preliminary seal member 1390 may be in direct contact with a portion of the preliminary first pad electrode pattern 1431 and the preliminary second pad electrode pattern 1432. The preliminary seal member 1390 may be formed using frit, etc. The preliminary seal member 1390 may include a photo curable material. For example, the preliminary seal member 1390 may include a compound such as the organic material and the photo curable material. After one or more of ultraviolet ray, laser beam, visible ray, etc. are irradiated in the compound, the compound may be cured, and thus the preliminary seal member 1390 may be obtained. The photo curable material included in the preliminary seal member 1390 may include epoxy acrylate-based resin, polyester acrylate-based resin, urethane acrylate based-resin, polybutadiene acrylate-based resin, silicon acrylate-based resin, alkyl acrylate-based resin, etc.

An upper substrate 410 may be formed on the preliminary seal member 1390 and the upper electrode 340. The upper substrate 410 and the lower substrate 110 may include substantially same materials. For example, the upper substrate 410 may be formed using a quartz substrate, a synthetic quartz substrate, a calcium fluoride substrate, a fluoride-doped quartz substrate, a soda-lime glass substrate, a non-alkali glass substrate etc. In some example embodiments, the upper substrate 410 may include a transparent inorganic material or flexible plastic. In embodiments, after the preliminary seal member 1390 is formed on the upper substrate 410, the upper substrate 410 and the preliminary seal member 1390 may be connected to the lower substrate 110.

After the upper substrate 410 is formed, a laser may be irradiated on the preliminary seal member 1390. In response to an irradiation of the light of the laser, a state of the preliminary seal member 1390) may be changed from a solid state to a liquid state. The preliminary seal member 1390 of the liquid state may be cured to the solid state after a predetermined time. After the state change of the preliminary seal member 1390, the preliminary seal member 1390 may seal the lower substrate 110 and the upper substrate 410.

After the upper substrate 410 and the lower substrate 110 are sealed, a portion of the upper substrate 410, a portion of the lower substrate 110, a portion of the preliminary seal member 1390, and the preliminary pad electrode 1430 that are located in the first peripheral region may be removed along a line III-III' illustrated in FIG. 15.

Referring to FIG. 16, after a portion of the upper substrate 410, a portion of the lower substrate 110, a portion of the preliminary seal member 1390, and the preliminary pad electrode 1430 that are located in the first peripheral region are removed, a seal member 390 and a pad electrode 430 including a first pad electrode pattern 431 and a second pad electrode pattern 432 may be formed.

A first portion (e.g., one side surface) of the first pad electrode pattern 431 may be aligned/coplanar with an outmost surface of the seal member 390, and a second portion, which is opposite to the first portion, of the first pad electrode pattern 431 may extend from the peripheral region 20 into display region 10.

A first portion (e.g., one side surface) of the second pad electrode pattern 432 may be aligned/coplanar with an outmost surface of the seal member 390, and a second portion, which is opposite to the first portion, of the second pad electrode pattern 432 may be formed within the seal member 390. Alternatively, the second portion of the second pad electrode pattern 432 may extend in a direction from the peripheral region 20 into the display region 10.

A first portion (e.g., one side surface) of the seal member 390 may be aligned/coplanar with an outmost surface of each of the substrates 110 and 410, and a second portion, which is opposite to the first portion, of the seal member 390 may be located within the OLED display device.

Referring to FIG. 17, an organic layer 1490 is formed on an outmost surface of one or more of the seal member 390, the pad electrodes 430, the substrate 110, and the substrate 410. The organic layer 1490 may cover one side surface each of the pad electrodes 430 that is exposed by the seal member 390. The organic layer 1490 may include polyimide, siloxane, etc.

Referring to FIG. 18, after the organic layer 1490 is formed, organic patterns 490 may be formed by patterning the organic layer 1490. The organic patterns 490 may expose the pad electrodes 430. After the organic patterns 490 are formed, a metal layer may be formed on the outmost surfaces of the pad electrodes 430 and seal member 390 that are exposed by the organic patterns 490.

Referring to FIG. 19, after the metal layer is formed, side electrodes 470 located between the organic patterns 490 may be formed between the organic patterns 490. The side electrodes 470 may be in direct contact with corresponding side surfaces of the pad electrodes 430 and may be electrically connected to the corresponding pad electrodes 430. The side electrodes 470 may protrude from/beyond an outmost surface of one or more of the seal member 390, the pad electrodes 430, the substrate 110, and the substrate 410 in the first direction D1.

The side electrodes 470 each may include the first metal layer 471, the second metal layer 472, and the third metal layer 473 illustrated in FIG. 6.

The first metal layer 471 may be in contact with the pad electrode 430, and may be formed using a metal having a relatively high metal adhesive force. For example, the first metal layer 471 may consist essentially of Ti, Mo, Ni, Ta, Nd, etc.

The second metal layer 472 may be formed on the first metal layer 471, and may formed using a metal having a relatively low electrical resistance. For example, the second metal layer 472 may consist essentially of Au, Ag, Cu, Al, etc.

The third metal layer 473 may be disposed on the second metal layer 472, and may be formed using a metal having a relatively high mechanical strength. The third metal layer 473 may protect the second metal layer 472. For example, the third metal layer 473 may consist essentially of Ti, Mo, an alloy of Ti, an alloy of Mo, etc. and may have a metal with a Mohs hardness of 5 or more. The OLED display device 100 may have a minimized non-display area.

Embodiments may be applied to various display devices including an organic light emitting diode display device. For example, embodiments may be applied to vehicle-display device, a ship-display device, an aircraft-display device, portable communication devices, display devices for display or for information transfer, a medical-display device, etc.

The foregoing is illustrative of example embodiments and is not to be construed as limiting. Although a few example embodiments have been described, many modifications are possible in the example embodiments. All modifications are intended to be included within the scope defined in the claims.

What is claimed is:

1. A display device comprising:
a first substrate;
a pixel overlapping a first face of the first substrate;
a contact electrode electrically connected to the pixel, wherein a first face of the contact electrode overlaps the first face of the first substrate; and
a side electrode positioned beyond the first substrate, wherein a first face of the side electrode directly contacts a second face of the contact electrode, wherein the second face of the contact electrode is not parallel to the first face of the contact electrode,
wherein the side electrode includes:
a first metal layer directly contacting the contact electrode and overlapping the first substrate;
a second metal layer disposed on the first metal layer and not directly contacting the first substrate; and a third metal layer disposed on the second metal layer and not directly contacting the first substrate, and wherein a face of the first metal layer is not perpendicular to the first face of the first substrate and is coplanar with each of a face of the second metal layer and a face of the third metal layer.

2. The display device of claim 1, wherein the first face of the side electrode is parallel to a second face of the first substrate, and wherein the second face of the first substrate is not parallel to the first face of the first substrate.

3. The display device of claim 1, further comprising a second substrate, wherein the contact electrode is positioned between the first face of the first substrate and a first face of the second substrate, wherein a second face of the first substrate is coplanar with a second face of the second substrate and is coplanar with the second face of the contact electrode.

4. The display device of claim 1, wherein the first metal layer is positioned between the contact electrode and the second metal layer.

5. The display device of claim 4, wherein an electrical resistance of the second metal layer is lower than an electrical resistance of the first metal layer, and wherein an adhesive force of the first metal layer is greater than an adhesive force of the second metal layer.

6. The display device of claim 4, wherein the first metal layer includes at least one of titanium (Ti), molybdenum (Mo), nickel (Ni), tantalum (Ta), and neodymium (Nd).

7. The display device of claim 4, wherein the second metal layer includes at least one of silver (Ag), copper (Cu), aluminum (Al), and gold (Au).

8. The display device of claim 1, wherein a material of the contact electrode is identical to at least one of a material of a gate electrode of the pixel and a material of a drain electrode of the pixel.

9. The display device of claim 1, further comprising a second substrate, wherein the contact electrode is positioned between the first face of the first substrate and a first face of the second substrate and is positioned closer to the first substrate than to the second substrate, and wherein the first face of the side electrode directly contacts a second face of the second substrate.

10. The display device of claim 9, wherein the first face of the side electrode directly contacts a second face of the first substrate.

11. The display device of claim 1, further comprising an organic member directly contacting a second face of the side electrode, wherein the second face of the side electrode is not parallel to the first face of the side electrode.

12. The display device of claim 1, wherein the pixel comprises a transistor, wherein the transistor comprises a first transistor electrode and a second transistor electrode, wherein the contact electrode comprises a first conductive layer and a second conductive layer, wherein the first conductive layer is positioned between the first substrate and the second conductive layer, wherein a material of the first conductive layer is identical to a material of the first transistor electrode, and wherein a material of the second conductive layer is identical to a material of the second transistor electrode.

13. The display device of claim 12, wherein the first transistor electrode is a gate electrode, and wherein the second transistor electrode is a drain electrode.

14. The display device of claim 13, wherein the first conductive layer directly contacts the first substrate, and wherein the gate electrode is spaced from the first substrate.

15. The display device of claim 12, further comprising: a gate insulation layer positioned between the first transistor electrode and the first substrate; and an insulating interlayer positioned between the first transistor electrode and the second transistor electrode, wherein both the gate insulation layer and the insulating interlayer are spaced from the contact electrode.

16. The display device of claim 1, further comprising: a second substrate; and
 a seal member disposed between the first substrate and the second substrate, directly contacting the second substrate, and directly contacting the contact electrode.

17. The display device of claim 16, wherein the seal member partially covers the contact electrode and partially exposes the contact electrode.

18. The display device of claim 16, wherein the seal member directly contacts the first face of the side electrode.

19. The display device of claim 16, wherein the contact electrode comprises a first conductive layer and a second conductive layer, wherein the first conductive layer is positioned between the first substrate and the second conductive layer, wherein the seal member is narrower than the first conductive layer and wider than the second conductive layer in a direction parallel to the first face of the first substrate.

20. A display device comprising:
 a first substrate;
 a pixel overlapping a first face of the first substrate;
 a contact electrode electrically connected to the pixel, wherein a first face of the contact electrode overlaps the first face of the first substrate; and
 a side electrode positioned beyond the first substrate,
 wherein a first face of the side electrode directly contacts a second face of the contact electrode,
 wherein the second face of the contact electrode is not parallel to the first face of the contact electrode,
 wherein the side electrode includes: a first metal layer directly contacting the contact electrode; a second metal layer disposed on the first metal layer; and a third metal layer disposed on the second metal layer,
 wherein the second metal layer is positioned between the first metal layer and the third metal layer,
 wherein a face of the first metal layer is not perpendicular to the first face of the first substrate and is coplanar with each of a face of the second metal layer and a face of the third metal layer, and
 wherein a mechanical strength of the third metal layer is greater than each of a mechanical strength of the first metal layer and a mechanical strength of the second metal layer.

\* \* \* \* \*